(12) United States Patent
Ui et al.

(10) Patent No.: US 9,172,865 B2
(45) Date of Patent: Oct. 27, 2015

(54) IMAGE PICKUP APPARATUS, SOLID-STATE IMAGE PICKUP DEVICE, AND IMAGE PICKUP METHOD

(71) Applicant: Sony Corporation, Tokyo (JP)

(72) Inventors: Hiroki Ui, Tokyo (JP); Yutaka Nishimura, Kanagawa (JP); Shinichi Fujii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/573,779

(22) Filed: Dec. 17, 2014

(65) Prior Publication Data

US 2015/0103233 A1    Apr. 16, 2015

Related U.S. Application Data

(63) Continuation of application No. 13/637,734, filed as application No. PCT/JP2011/058863 on Apr. 1, 2011, now Pat. No. 8,953,085.

(30) Foreign Application Priority Data

Apr. 8, 2010    (JP) .................... 2010-089796

(51) Int. Cl.
| | |
|---|---|
| H04N 5/225 | (2006.01) |
| H04N 5/232 | (2006.01) |
| G03B 13/36 | (2006.01) |
| H01L 27/146 | (2006.01) |
| H04N 5/369 | (2011.01) |

(52) U.S. Cl.
CPC ............ *H04N 5/23212* (2013.01); *G03B 13/36* (2013.01); *H01L 27/14627* (2013.01); *H01L 27/14641* (2013.01); *H04N 5/3696* (2013.01)

(58) Field of Classification Search
CPC .......... H04N 5/23203; H04N 5/23212; H04N 5/23216; H04N 5/3696; G03B 13/36; H01L 27/14641; H01L 27/14627
USPC .......................... 348/345, 348, 349, 350, 354
IPC ..................... H04N 5/23203, 5/23212, 5/23216
See application file for complete search history.

(56) References Cited

U.S. PATENT DOCUMENTS

2009/0027541 A1    1/2009  Takayama et al.
2010/0045849 A1*   2/2010  Yamasaki ..................... 348/349

FOREIGN PATENT DOCUMENTS

| JP | 2000-305010 | 11/2000 |
|---|---|---|
| JP | 2008-263352 | 10/2008 |
| JP | 2009-015164 | 1/2009 |

(Continued)

OTHER PUBLICATIONS

Supplementary European Search Report issued in connection with related EP application No. EP 11766003 dated Jun. 23, 2014.

(Continued)

*Primary Examiner* — Yogesh Aggarwal
(74) *Attorney, Agent, or Firm* — Dentons US LLP

(57) ABSTRACT

A solid-state image pickup device includes a lens, a first light receiving element, a second light receiving element, and an element separation area. The first light receiving element is configured to receive light from the lens. The second light receiving element is configured to receive light from the lens. The element separation area is between the first light receiving element and the second light receiving element. The lens has an optical axis, which is offset from a center of the element separation area.

14 Claims, 22 Drawing Sheets

(56) References Cited

FOREIGN PATENT DOCUMENTS

| | | |
|---|---|---|
| JP | 2010-049209 | 3/2010 |
| WO | WO/2008/132812 | 11/2008 |

OTHER PUBLICATIONS

Japanese Office Action issued in connection with related Japanese patent application No. JP 2010-089796 dated Jan. 28, 2014.

* cited by examiner

FIG. 17
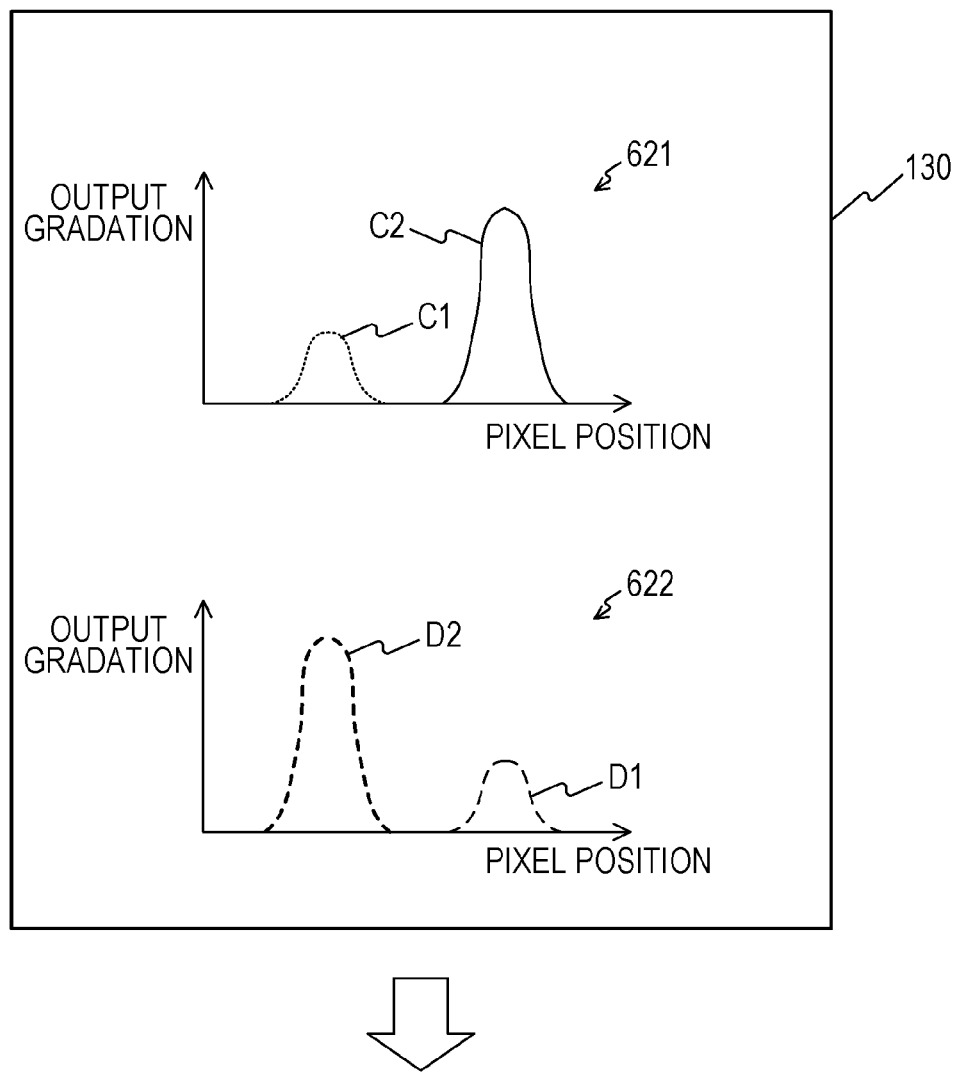
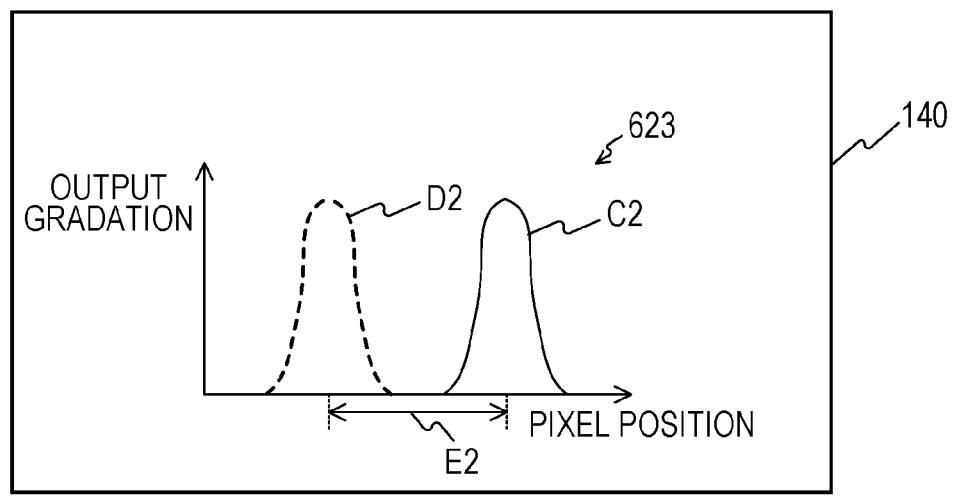

FIG. 18
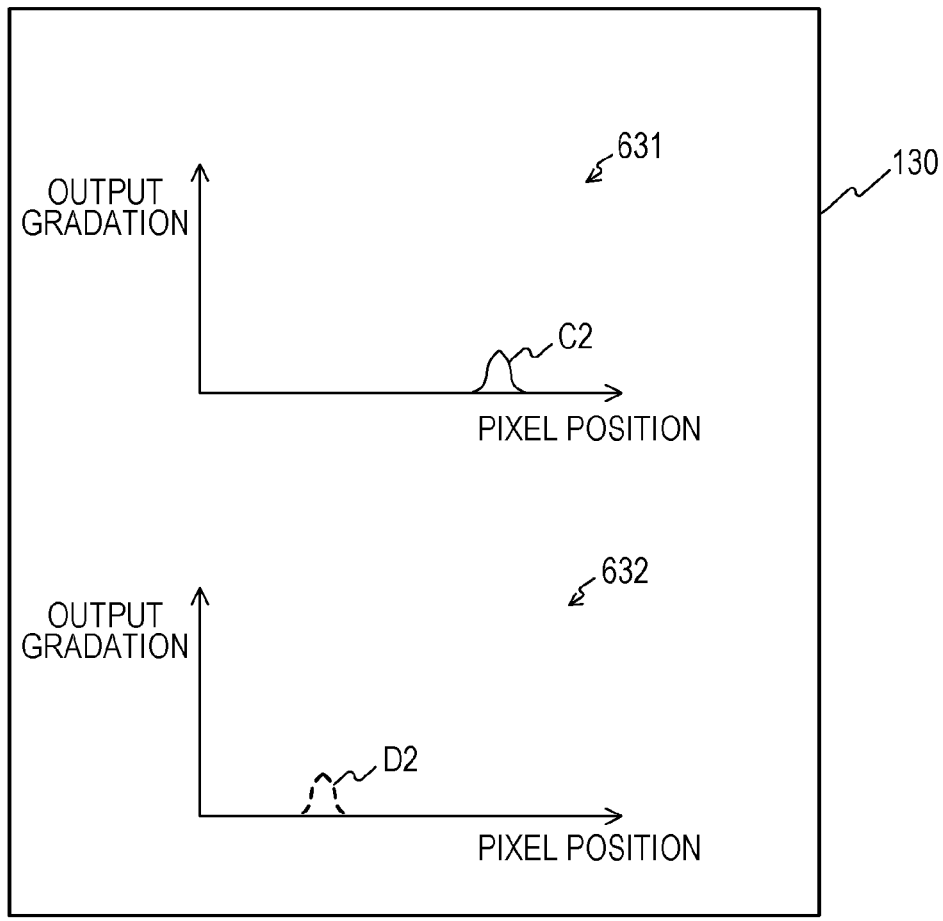
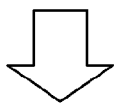
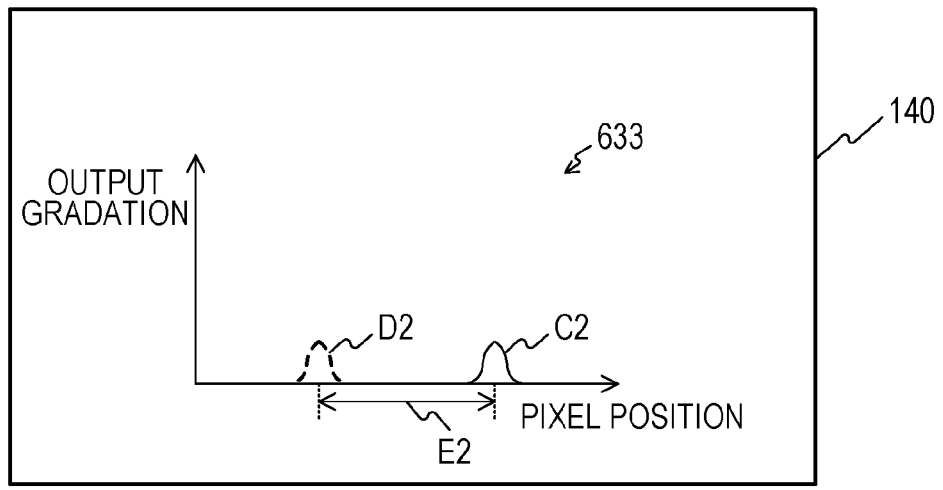

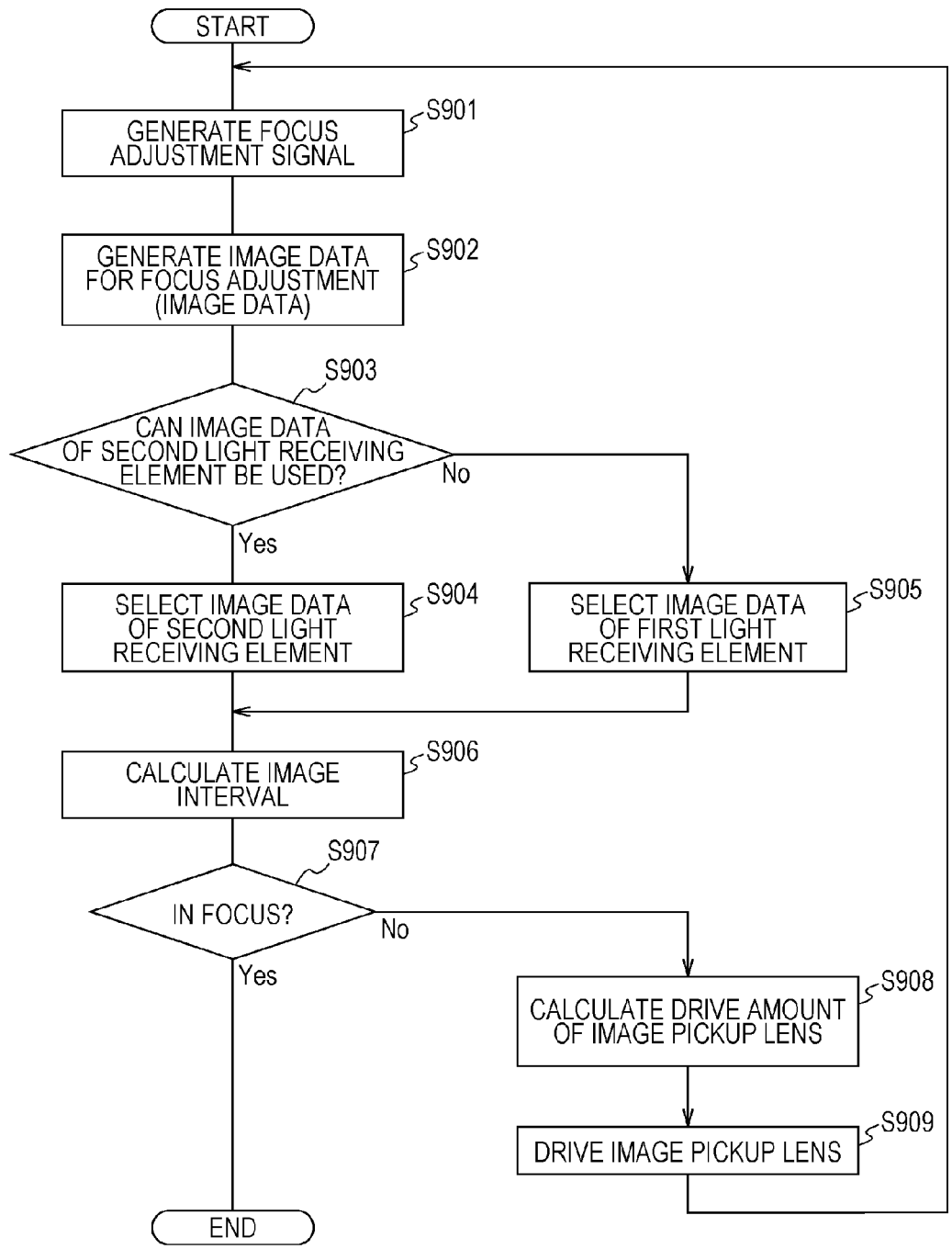

IMAGE PICKUP APPARATUS, SOLID-STATE IMAGE PICKUP DEVICE, AND IMAGE PICKUP METHOD

RELATED APPLICATION DATA

This application is a continuation of U.S. patent application Ser. No. 13/637,734, filed Sep. 27, 2012, which is the Section 371 National Stage of PCT/JP2011/058863 filed Apr. 1, 2011. This application claims the benefit of priority to Japanese Patent Application No. 2010-089796, filed Apr. 8, 2010, which is incorporated herein by reference in its entirety to the extent permitted by law.

The present invention relates to an image pickup apparatus and particularly relates to an image pickup apparatus that performs a phase difference detection, a solid-state image pickup device, an image pickup method, and a program that causes a computer to execute the method.

BACKGROUND ART

In recent years, an image pickup apparatus has been available, such as a digital still camera that generates a picked-up image by picking up an image of a subject such as a person and records this generated picked-up image. Also, as this image pickup apparatus, to facilitate an image pickup operation by a user, an image pickup apparatus provided with an auto focus (AF: Auto Focus) function for automatically performing a focus (focus point, focal point) adjustment at the time of image pickup has been widely available.

For such an image pickup apparatus, for example, an image pickup apparatus that forms a pair of images by performing pupil division on light that passes through an image pickup lens and measures an interval between the formed images (detects a phase difference) to decide a position of the image pickup lens is proposed (for example, see PTL 1.). This image pickup apparatus forms a pair of images by providing an image sensor with a pixel for focus detection where a pair of light receiving elements are provided to one pixel and calculates a shift amount of the focus by measuring an interval between the formed images. Then, this image pickup apparatus calculates a movement amount of the image pickup lens on the basis of the calculated shift amount of the focus and adjusts the position of the image pickup lens on the basis of the calculated movement amount to effect focusing (focus adjustment).

According to the above-mentioned conventional technology, as both pixels including the pixel for phase difference detection (focus detection) and the pixel for picked-up image generation are provided to one image sensor, it is not necessary to separately provide two sensors, i.e. a sensor for focus detection and a sensor for picked-up image.

CITATION LIST

Patent Literature

PTL 1: Japanese Unexamined Patent Application Publication No. 2000-305010 (FIG. 1)

SUMMARY OF INVENTION

However, regarding the above-mentioned conventional technology, the inventors have recognized that in the pixels for focus detection, as the two light receiving elements are irradiated with the lights subjected to the pupil division at substantial equal amounts, in a case where the light amount incident on each of the light receiving elements is relatively low or a case of being excessive, a pair of images cannot be formed accurately. According to this, the amount of the shift of the focus cannot be calculated accurately, and the accuracy of the focus adjustment may decrease.

Disclosed herein are one or more inventions that are configured to improve an accuracy of the focus adjustment.

In an embodiment, an imaging device has a light sensor comprising two light sensitive elements asymmetrically positioned about opposite sides of a centerline of the light sensor.

In an embodiment, a solid state image pickup device include a lens, a first light receiving element, a second light receiving element, and an element separation area. The lens has an optical axis. The first light receiving element is configured to receive light from the lens. The second light receiving element is configured to receive light from the lens. The element separation area is between the first light receiving element and the second light receiving element. The optical axis of the lens is offset from a center of the element separation area.

In an embodiment, an image pickup apparatus includes an image sensor and a signal processing unit. The image sensor is configured to perform photoelectric conversion on incident light to generate an electric signal. The image sensor includes a first pixel. The first pixel includes (a) a lens having an optical axis, (b) a first light receiving element configured to convert light from the lens into an electric signal, (c) a second light receiving element configured to convert light from the lens into an electric signal, and (d) an element separation area between the first light receiving element and the second light receiving element. The signal processing unit is configured to generate image data corresponding to electric signals from the first light receiving element and generate image data corresponding to electric signals from the second light receiving element. The optical axis of the first pixel is offset from a center of the element separation area of the first pixel.

In an embodiment, a method for controlling a solid-state image pickup device includes generating a first electric signal and generating a second electric signal. The first electric signal is generated via a first light receiving element. The first light receiving element is configured to receive light from a lens of a pixel. The second electric signal is generated via a second light receiving element. The second light receiving element is configured to receive light from the lens of the pixel. The pixel includes an element separation area between the first light receiving element and the second light receiving element. An optical axis of the lens is offset from a center of the element separation area.

In an embodiment, a method for controlling an image pickup apparatus includes receiving a first electric signal from a first light receiving element, receiving a second electric signal from a second light receiving element, and generating image data corresponding to electric signals from the first light receiving element and the second light receiving element. The first light receiving element is configured to receive light from a lens of a pixel. The second light receiving element is configured to receive light from the lens of the pixel. The pixel includes an element separation area between the first light receiving element and the second light receiving element. The optical axis of the lens is offset from a center of the element separation area.

BRIEF DESCRIPTION OF DRAWINGS

FIG. 17 illustrates a phase difference detection example at the time of back focus according to the first embodiment.

FIG. 18 illustrates a phase difference detection example when the amount of light is relatively low or small according to the first embodiment.

FIG. 20 is a flow chart illustrating a focus control procedure example by the image pickup apparatus according to the first embodiment.

DESCRIPTION OF THE PRESENTLY PREFERRED EMBODIMENTS

Hereinafter, devices and constructions embodying principles of the present invention(s) (herein referred to as embodiments) will be described. The description will be carried out in the following order.

1. First Embodiment (image pickup control: an example of setting arrangement positions of a pair of light receiving elements asymmetrical)

2. Second Embodiment (image pickup control: an example of adjusting an arrangement position of a micro lens)

3. Third Embodiment (image pickup control: an example of arranging two signal lines)

<1. First Embodiment>

[Functional Configuration Example of Image Pickup Apparatus]

Figure 1:
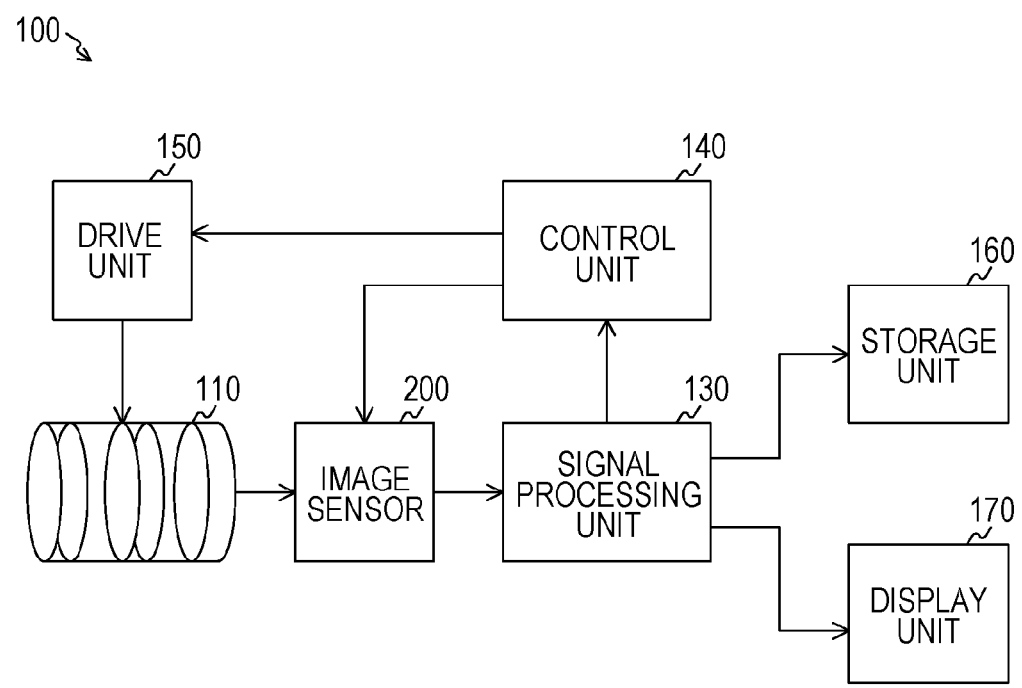
FIG. 1 is a block diagram illustrating a configuration example of an image pickup apparatus according to a first embodiment.

FIG. 1 is a block diagram illustrating a configuration example of an image pickup apparatus 100 according to a first embodiment. This image pickup apparatus 100 is provided with a lens unit 110, an image sensor 200, a signal processing unit 130, a control unit 140, a drive unit 150, a storage unit 160, and a display unit 170.

It should be noted that this image pickup apparatus 100 is configured to perform an AF (Auto Focus) control based on a phase difference detection system. This phase difference detection system is a system in which an image interval of subjects separated by two lenses is measured, and a position of an image pickup lens is decided on the basis of the position where this image interval becomes a predetermined value.

The lens unit 110 is composed of a plurality of image pickup lenses such as a focus lens and a zoom lens and is configured to supply incident light from a subject which is input via these lenses to the image sensor 200. This lens unit 110 is adjusted so that the focus (which is also referred to as focus point or focal point) with respect to the subject is effected while positions of the plurality of image pickup lenses are adjusted by the drive unit 150.

The image sensor 200 is an image pickup element that performs photoelectric conversion on the incident light from the subject passing through the lens unit 110 on the basis of a control by the control unit 140 into an electric signal. This image sensor 200 is composed of a pixel that generates an electric signal (image pickup signal) for generating a picked-up image and a pixel that generates an electric signal (focus adjustment signal) for adjusting the focus. This image sensor 200 supplies the electric signal generated through the photoelectric conversion to the signal processing unit 130. It should be noted that the image sensor 200 is supposed to have a substantially rectangular shape. Also, the pixel that generates the image pickup signal (image pickup pixel) will be described in detail with respect to FIGS. 2A and 2B. Also, the pixel that generates the focus adjustment signal (focus detection pixel) will be described in detail by using FIGS. 3 to 9. Also, this image sensor 200 will be described in detail by using FIGS. 10 to 15. It should be noted that the image sensor 200 is an example of an image pickup element described in the scope of claims. Also, the focus adjustment signal is an example of a focus detection signal described in the scope of claims.

The signal processing unit 130 is configured to apply various signal processings on the electric signal supplied from the image sensor 200. For example, this signal processing unit 130 generates picked-up image data on the basis of the image pickup signal supplied from the image sensor 200 and supplies this generated picked-up image data to the storage unit 160 to be recorded in the storage unit 160 as the image file. Also, the signal processing unit 130 supplies the generated picked-up image data to the display unit 170 to be displayed as the picked-up image. Also, this signal processing unit 130 generates image data for focus adjustment on the basis of the focus adjustment signal supplied from the image sensor 200 and supplies this generated image data for focus adjustment to the control unit 140.

The control unit 140 is configured to calculate a shift amount of the focus (defocus amount) on the basis of the image data for focus adjustment supplied from the signal processing unit 130 and calculate a movement amount of the image pickup lens of the lens unit 110 on the basis of the calculated defocus amount. Then, this control unit 140 supplies information related to the calculated movement amount of the image pickup lens to the drive unit 150. That is, this control unit 140 performs an in-focus determination by calculating the shift amount of the focus, generates information related to the movement amount of the image pickup lens on the basis of this in-focus determination result, and supplies this generated information to the drive unit 150. It should be noted that the control unit 140 is an example of a determination unit described in the scope of claims.

The drive unit 150 is configured to move the image pickup lens of the lens unit 110 on the basis of the information related to the movement amount of the image pickup lens supplied from the control unit 140.

The storage unit 160 is configured to store the picked-up image data supplied from the signal processing unit 130 as an image file.

The display unit 170 is configured to display the picked-up image data supplied from the signal processing unit 130 as a picked-up image (for example, a through-the-lens image).

[Configuration Example of Image Pickup Pixel]

Figure 2A:
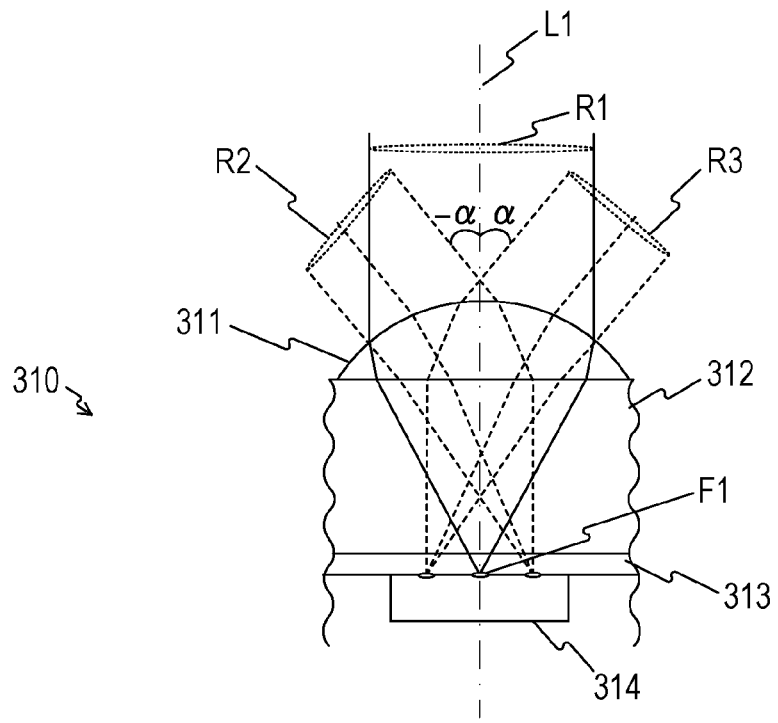
FIG. 2A is a cross sectional view and FIG. 2B is a top view, schematically illustrating an example of an image pickup element.
Figure 2B:
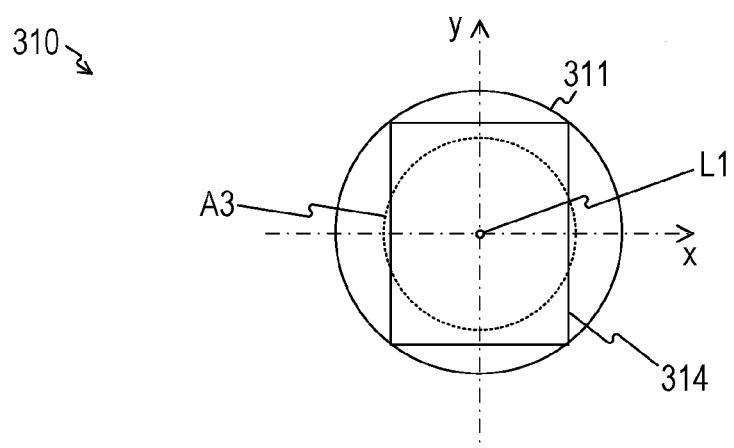

FIG. 2A is a cross sectional view and FIG. 2B is a top view schematically illustrating an example of an image pickup pixel 310. The image pickup pixel 310, illustrated in FIGS. 2A and 2B, is an example of a pixel (image pickup pixel) that generates an image pickup signal among the respective pixels constituting the image sensor 200.

FIG. 2A schematically illustrates a cross sectional configuration of the image pickup pixel 310 in the image sensor 200.

This image pickup pixel 310 is provided with a planarizing film 312, an insulating film 313, and a light receiving element 314. Also, a micro lens 311 that condenses light incident on the image pickup pixel 310 to the light receiving element 314 is provided on the image pickup pixel 310.

It should be noted that herein, the light passing through the micro lens 311 is in focus on a light receiving plane of the light receiving element 314.

The micro lens 311 is arranged so that the center of the micro lens 311 and the center of the light receiving element 314 are located on a same axis. Also, this micro lens 311 is arranged so that a light receiving position of the light receiving element 314 and a position of a focus F1 of the micro lens 311 are on a same plane.

The planarizing film 312 and the insulating film 313 are layers composed of a transparent insulating material which cover the light receiving plane of the light receiving element 314. It should be noted that a color filter of red, green, or blue is arranged between the planarizing film 312 and the insulating film 313 in an actual apparatus, but according to the first embodiment, for the sake of simplicity in the description, the image sensor 200 that detects monochrome (brightness of light) is supposed.

The light receiving element 314 is configured to generate an electric signal at an intensity in accordance with the amount of the received light by converting the received light into the electric signal (photoelectric conversion). This light receiving element 314 is composed, for example, of a photo diode (PD: Photo Diode).

Here, the light incident on the light receiving element 314 (incident light) will be described by using FIG. 2A. FIG. 2A schematically illustrates light incident on the micro lens 311 at an angle in parallel to an axis L1 which is parallel to the optical axis passing through the center position of the micro lens 311 (light irradiated in a range R1 illustrated in FIG. 2A) among the light incident on the light receiving element 314. Also, FIG. 2A schematically illustrates light incident on the micro lens 311 (light incident in ranges R2 and R3 illustrated in FIG. 2A) at an angle inclined by predetermined angles with respect to the axis L1 (angles $-\alpha$ and $\alpha$ illustrated in FIG. 2A). It should be noted that the axis L1 is an example of an optical axis of the micro lens described in the scope of claims.

The light incident in the range R1 (range R1 incident light) is light incident on the micro lens 311 at an angle in parallel to the axis L1. This range R1 incident light is condensed by the micro lens 311 at the focus F1.

The lights incident in the ranges R2 and R3 (the range R2 incident light and the range R3 incident light) are lights incident on the micro lens 311 at an angle inclined by predetermined angles ($-\alpha$ and $\alpha$) with respect to the axis L1. These range R2 incident light and range R3 incident light are incident lights illustrating examples of light incident on the micro lens 311 at an angle inclined by predetermined angles with respect to the axis L1. These range R2 incident light and range R3 incident light are condensed in a predetermined area in the light receiving plane of the light receiving element 314.

FIG. 2B illustrates an example of an irradiation position of the light incident on the image pickup pixel 310 illustrated in FIG. 2A.

It should be noted that in this FIG. 2B, a description will be given while an xy coordinate system is supposed in which an intersecting point of the axis L1 parallel in an optical axis direction passing through the center position of the micro lens 311 and the light receiving plane of the light receiving element 314 is set as an origin, a long side in the image sensor 200 is set as an x axis, and a narrow side thereof is set as the y axis. Also, similarly also with respect to an xy coordinate system which will be described below, a description will be given while the xy coordinate system is supposed in which the intersecting point of the axis parallel to the optical axis passing through the center position of the micro lens and the light receiving plane of the light receiving element is set as the origin, the long side in the image sensor 200 is set as the x axis, and the narrow side thereof is set as the y axis.

In this FIG. 2B, components except for a light distribution area A3 are the same as those illustrated in FIG. 2A, the same reference symbols as those of FIG. 2A are assigned, and a description herein will be omitted.

The light distribution area A3 is an area where the light receiving plane of the light receiving element 314 is irradiated with the incident light on the micro lens 311. As illustrated in FIG. 2A, the light irradiated on this light distribution area A3 (irradiation light) becomes light having a larger incident angle on the micro lens 311 as being away from the axis L1.

Here, the irradiation light in the light distribution area A3 will be described. This is generated because the lens unit 110 is a telecentric optical system or due to a phenomenon called marginal illumination decrease of the micro lens itself (for example, cosine fourth-power law). For example, a consideration is given of the marginal illumination decrease of the micro lens itself in a case where $\alpha$ illustrated in FIG. 2A is set as 32 degrees. In this case, the light amount on the light receiving plane of the incident light that is incident at the angle $\alpha$ (32 degrees) is substantially half of the light amount in the area where the light is parallel to the optical axis (focus F1). That is, in the irradiation light in the light receiving element 314, the light in the vicinity of the center of the light receiving element 314 (in the vicinity of the axis L1) is the strongest and weakens as being closer to the end portion from the center of the light receiving element 314.

[Configuration Example of Focus Detection Pixel]

Figure 3A:
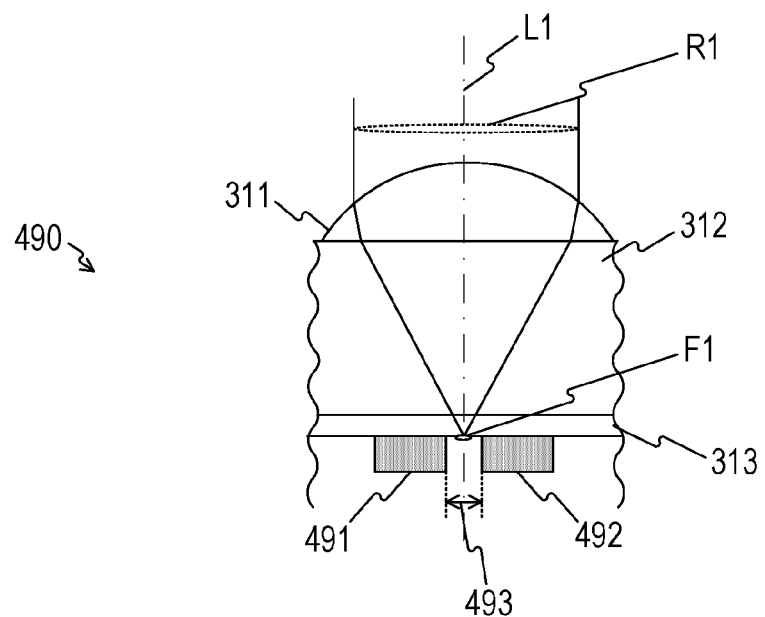
FIGS. 3A and 3B includes cross sectional views, schematically illustrating examples of focus detection pixels according to the first embodiment.
Figure 3B:
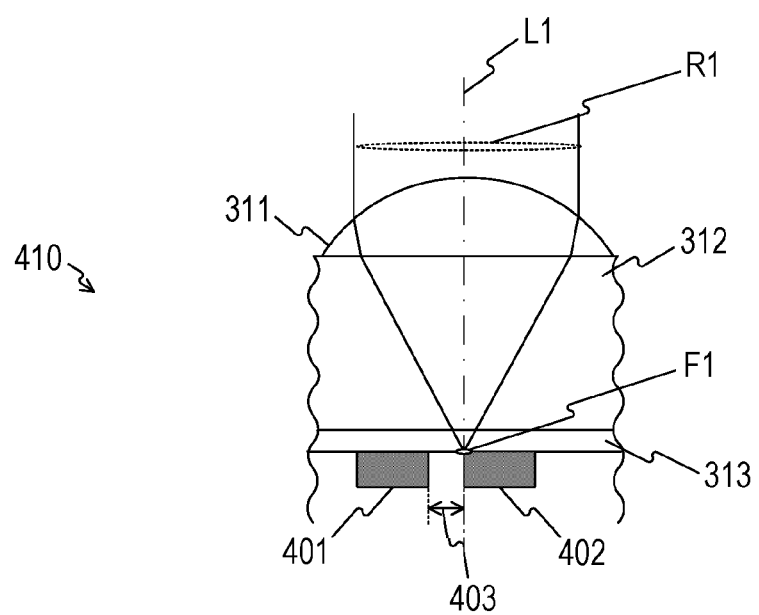

FIGS. 3A and 3B are cross sectional views schematically illustrating an example of a focus detection pixel according to the first embodiment. FIG. 3A illustrate cross sectional views of a focus detection pixel 490 and FIG. 3B illustrates a focus detection pixel 410 having a different configuration from the focus detection pixel in the conventional image pickup apparatus. These focus detection pixels 410 and 490 are examples of pixels that generate focus adjustment signals (focus detection pixels) among the respective pixels constituting the image sensor 200. It should be noted that an arrangement configuration of the focus detection pixels in the image sensor 200 will be described in detail with reference to FIG. 11 to FIG. 15.

It should be noted that according to the first embodiment, the micro lenses 311 in the focus detection pixels 410 and 490 are set to be the same as the micro lens 311 of the image pickup pixel 310 illustrated in FIGS. 2A and 2B.

Also, according to the first embodiment, the size of the entire pixel of each of the focus detection pixels 410 and 490 is the same as the size of the image pickup pixel 310 illustrated in FIGS. 2A and 2B. Also, according to the first embodiment, in each of the focus detection pixels 410 and 490, the center of the focus detection and the axis L1 are set to be located on the same line.

FIG. 3A schematically illustrates a cross sectional configuration of the focus detection pixel 490. In FIG. 3A, a cross sectional configuration is illustrated in a case where the left and right direction of FIG. 3A is set as the narrow direction of the light receiving element in the focus detection pixel 490.

It should be noted that as the incident light of the focus detection pixels 410 and 490 is similar to that of FIG. 2A, only a range R1 incident light is illustrated, and an illustration of a range R2 incident light and a range R3 incident light that are examples of the incident light at an angle inclined by a predetermined angle will be omitted.

It should be noted that in FIG. 3A, configurations except for a first light receiving element 491, a second light receiving element 492, and an element separation area 493 are the same as the respective components of the image pickup pixel 310 illustrated in FIG. 2A, and a description herein will therefore be omitted while assigning the same reference symbols of FIG. 2A.

The first light receiving element 491 is a light receiving element that forms a pair with the second light receiving element 492 and is configured to receive one of the two incident lights subjected to the pupil division. This first light receiving element 491 generates an electric signal in accordance with the amount of received light by converting the received light into an electric signal (photoelectric conversion) similarly as in the light receiving element 314 illustrated in FIG. 2A. Also, this first light receiving element 491 is a light receiving element having the same size and performance as those of the second light receiving element 492. It should be noted that as the focus detection pixels 410 and 490 having the same size as the image pickup pixel 310 are provided with two light receiving elements, with regard to the area, the area of the plane for receiving the light of the first light receiving element 491 is smaller than or equal to the half as compared with the light receiving element 314 of the image pickup pixel 310.

The second light receiving element 492 is a light receiving element that forms the pair with the first light receiving element 491 and is configured to receive the other one of the two incident lights subjected to the pupil division (light different from the light received by the first light receiving element 491). A function of this second light receiving element 492 is similar to the function of the first light receiving element 491, and a description herein will therefore be omitted.

The element separation area 493 is an insulating area located between the first light receiving element 491 and the second light receiving element 492 and is an area for separating so that the first light receiving element 491 and the second light receiving element 492 are not contacted with each other. This element separation area 493 is constructed between the first light receiving element 491 and the second light receiving element 492 so that the first light receiving element 491 and the second light receiving element 492 are located in parallel to each other. Also, this element separation area 493 is constructed so that the first light receiving element 491 and the second light receiving element 492 are located at an equal distance from the axis L1. For example, while a plane including the axis L1 is set as a symmetrical plane, the element separation area 493 is constructed so that the first light receiving element 491 and the second light receiving element 492 are symmetrical to each other.

That is, in the focus detection pixel 490, the axis L1 is located at the center of the element separation area 493. Also, as the center of the focus detection pixel 490 is coincided with the axis L1, the first light receiving element 491 and the second light receiving element 492 are constructed to be located at an equal distance from the center of the focus detection pixel 490.

It should be noted that according to the first embodiment, an interval between the first light receiving element 491 and the second light receiving element 492 by this element separation area 493 is set as the narrowest interval at which when the focus detection pixel is constructed, the first light receiving element 491 and the second light receiving element 492 can be constructed so as not to contact with each other.

FIG. 3B schematically illustrates a cross sectional configuration of the focus detection pixel 410. In FIG. 3B, a cross sectional configuration in a case where the left and right direction of FIG. 3B is set as the narrow direction of the light receiving element in the focus detection pixel 410 is illustrated. It should be noted that cross sectional configurations of focus detection pixels 420 to 480 illustrated in FIGS. 7 to 9 are similar to that of the focus detection pixel 410, and therefore the focus detection pixel 410 will be described herein, and a description of the focus detection pixels 420 to 480 will be omitted.

It should be noted that in FIG. 3B, a first light receiving element 401, a second light receiving element 402, and components except for an element separation area 403 are the same as or substantially similar to the respective components of the image pickup pixel 310 illustrated in FIG. 2A, and a description herein will therefore be omitted while assigning the same reference symbols. Also, the first light receiving element 401, the second light receiving element 402, and the element separation area 403 are similar to the first light receiving element 491, the second light receiving element 492, and the element separation area 493 illustrated in FIG. 3A, and a description herein will therefore be omitted.

The sizes of the first light receiving element 401, the second light receiving element 402, and the element separation area 403 in the focus detection pixel 410 illustrated in FIG. 3B are the sizes of the first light receiving element 491, the second light receiving element 492, and the element separation area 493 of the focus detection pixel 490 of FIG. 3A. That is, these focus detection pixel 410 and focus detection pixel 490 are different only in the light receiving plane of the light receiving element and the arrangement position of the light receiving element on the same plane. For this reason, in FIG. 3B, only the arrangement position of the first light receiving element 401, the second light receiving element 402, and the element separation area 403 will be described, and other descriptions will be omitted.

In this focus detection pixel 410, the second light receiving element 402 is constructed at a position where the end portion on the side of the element separation area 403 of the second light receiving element 402 tangent to the axis L1. On the other hand, with regard to the light receiving element 401, as compared with the end portion on the side of the element separation area 403 of the second light receiving element 402, the end portion on the side of the element separation area 403 of the light receiving element 401 is far from the axis L1. That is, in the focus detection pixel 410, the first light receiving element 401 and the second light receiving element 402 are constructed so that with respect to the plane including the axis L1, the first light receiving element 401 and the second light receiving element 402 are set to be asymmetric. It should be noted that the first light receiving element 401 and the second light receiving element 402 is an example of a pair of light receiving elements described in the scope of claims.

As illustrated in FIG. 3B, by arranging the first light receiving element 401 and the second light receiving element 402 asymmetric with respect to the axis L1, a part of the irradiation light in the vicinity of the axis L1 of the focus detection pixel 410 can be incident on the light receiving plane of the second light receiving element 492.

[Light Receiving Example of Focus Detection Pixel 490]

Figure 4A:
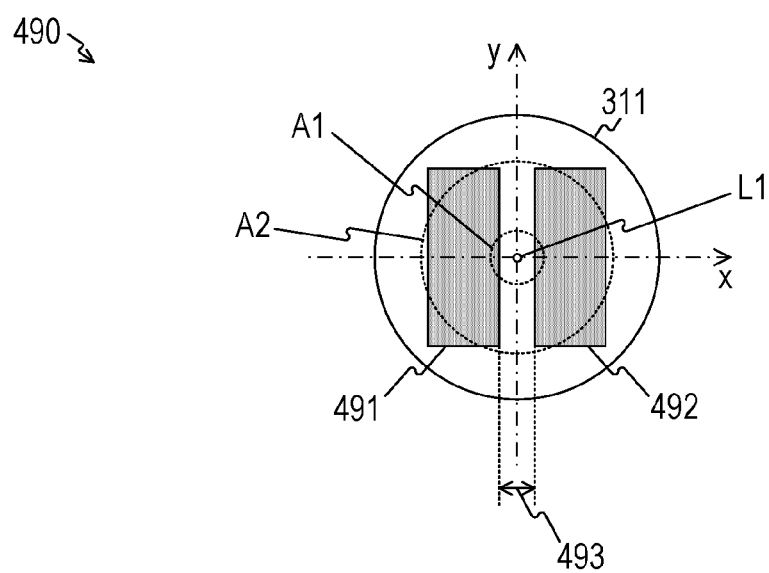
FIG. 4A is a top view schematically illustrating a focus detection element that is the same pixel as an existing focus detection element and FIG. 4B illustrates light receiving amounts of light incident on the focus detection element.
Figure 4B:
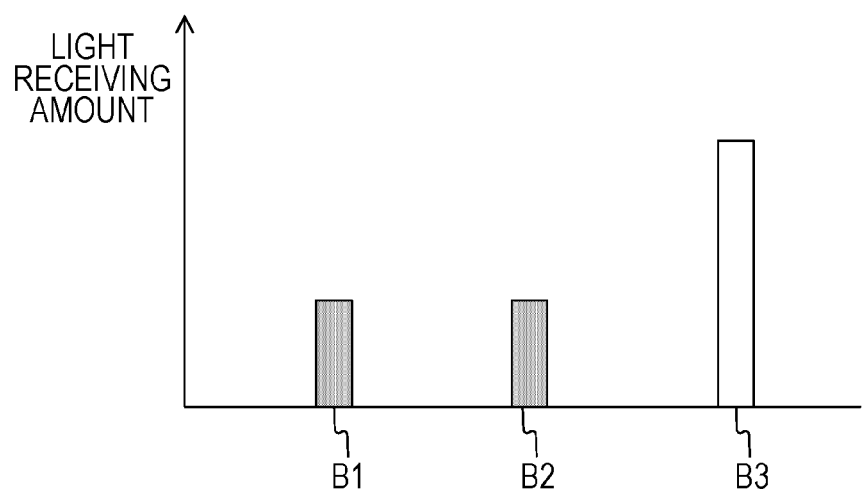

FIG. 4A is a top view schematically illustrating the focus detection pixel 490 and FIG. 4B is a diagram illustrating an example of a light receiving amount of the light incident on the focus detection pixel 490.

FIG. 4A illustrates an irradiation position example of the light incident on the focus detection pixel 490, illustrated in FIG. 3A.

It should be noted that components except for light distribution area A1 and light distribution area A2 are similar to those illustrated in FIG. 2B and FIG. 3A, and a description herein will therefore be omitted while assigning the same reference symbols. Also, in FIG. 4B, the light distribution area A1 and the light distribution area A2 are represented by dotted circles.

The light distribution area A1 is an area representing a region that receives a relatively small amount of light since a great portion of light in that area is irradiated on the element separation area 493. That is, this light distribution area A1 is an area where an angle of the light with respect to the axis L1 is small (non-telecentric light close to parallel rays of light (telecentric light)). As described in FIG. 2B, the light irradiated with the light receiving plane significantly decreases as being away from the axis L1 (focus F1) due to a marginal illumination decrease or the like. That is, the irradiation light in the light distribution area A1 has a larger light amount as compared with the irradiation light in the light distribution area A2 on an outer side of the light distribution area A1. However, a large part of the irradiation light in this light distribution area A1 is irradiated on the element separation area 493, and therefore only a part thereof is irradiated on the first light receiving element 491 and the second light receiving element 492. That is, a large part of the irradiation light in this light distribution area A1 is irradiated on the element separation area 493, and thus the light used for the photoelectric conversion in the first light receiving element 491 and the second light receiving element 492 is small.

The light distribution area A2 is an area on an outer side of the light distribution area A1 and is an area where the light incident on the micro lens 311 at an angle larger than the incident angle with respect to the axis L1 of the irradiation light in the light distribution area A1 (non-telecentric light at an angle largely different from parallel rays of light) is irradiated. The irradiation light in this light distribution area A2 has a smaller light amount as compared with the irradiation light in the light distribution area A1. For that reason, the light receiving amounts in the first light receiving element 491 and the second light receiving element 492 (total amount of irradiated lights) are supposed to be smaller than the light amount of the irradiation light in the element separation area 493 depending on the width of the light distribution area A1.

As illustrated in this FIG. 4A, the first light receiving element 491 and the second light receiving element 492 receive the light irradiated on the area away from the axis L1 to some extent (area on the outer side of the light distribution area A1). That is, on the first light receiving element 491 and the second light receiving element 492, the light whose light amount per area is weaker than the light irradiated on the light distribution area A1 (light at a larger angle than the light irradiated on the light distribution area A1) is irradiated.

FIG. 4B illustrates a graph representing an example of light receiving amounts of the first light receiving element 491 and the second light receiving element 492 (total amount of the irradiation lights). The graph in FIG. 4B indicates bar graphs representing a light receiving amount in the first light receiving element 491 (light receiving amount B1), a light receiving amount in the second light receiving element 492 (light receiving amount B2), and a total amount of the irradiation lights (irradiation amount B3) in the element separation area 493 while the vertical axis is set as the light receiving amount.

It should be noted that in FIG. 4B, as an example, a case is supposed and described in which the light amount of the irradiation light in the light distribution area A1 is extremely large, and on the other hand, the light amount of the irradiation light in the light distribution area A2 is relatively small.

The light receiving amount B1 and the light receiving amount B2 are light receiving amounts in the first light receiving element 491 and the second light receiving element 492. In these light receiving amount B1 and light receiving amount B2, it is illustrated that the first light receiving element 491 and the second light receiving element 492 are arranged at the symmetrical positions with respect to the axis L1, and therefore the light receiving amounts of the light receiving amount B1 and the light receiving amount B2 are equal to each other.

The irradiation amount B3 is a light amount irradiated on the element separation area 493. As an example, for this irradiation amount B3, it is illustrated that the light amount of the irradiation light in the element separation area 493 is larger than the light amount of the irradiation light in the first light receiving element 491 and the second light receiving element 492. For example, in a case where the lens unit 110 is a telecentric optical system as well as the element separation area 493 is wide to some extent, and also, the micro lens 311 and the light receiving element are proximal to each other, it is conceivable that the light amount of the irradiation light in the element separation area 493 becomes extremely large in this way.

In this manner, in the focus detection pixel 490, although the light amount of the irradiation light in the element separation area 493 becomes extremely large, the irradiation light in the light distribution area A1 is hardly used for the photoelectric conversion in the first light receiving element 491 and the second light receiving element 492.

[Light Receiving Example of the Focus Detection Pixel 410]

Figure 5A:
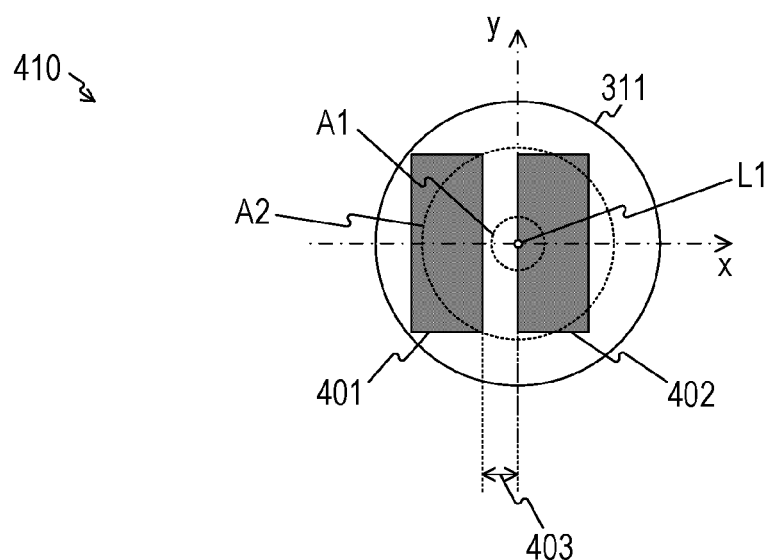
FIG. 5A is a top view schematically illustrating a focus detection element according to the first embodiment and FIG. 5B is a drawing illustrating an example of light receiving amounts of light incident on the focus detection element.
Figure 5B:
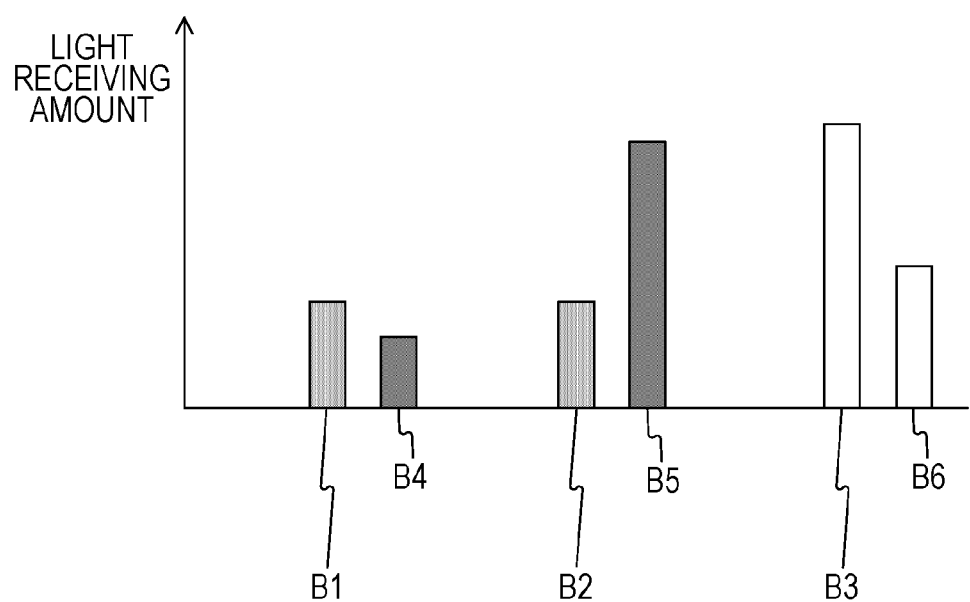

FIG. 5A is a top view schematically illustrating the focus detection pixel 410 and FIG. 5B is a drawing illustrating an example of the light receiving amount of the light incident on the focus detection pixel 490 according to the first embodiment.

FIG. 5A illustrates an irradiation position example of the light incident on the focus detection pixel 410 illustrated in FIG. 3B.

It should be noted that components except for the first light receiving element 401, the second light receiving element 402, and the element separation area 403 are similar to those illustrated in FIG. 2B, and a description herein will therefore be omitted while assigning the same reference symbols of FIG. 2B.

As illustrated in this FIG. 5A, in the focus detection pixel 410, the second light receiving element 402 is irradiated with the right half of the irradiation light in the light distribution area A1. That is, in the focus detection pixel 410, among the light incident on the light distribution area A1, the light irradiated on the right half of the light distribution area A1 (on the plus side on the x axis) from the direction of the left side of the micro lens 311 (on the minus side on the x axis) is received in the second light receiving element 402. On the other hand, the element separation area 403 is irradiated with the light collected in the vicinity of the focus F1 from the right side of the micro lens 311 (on the plus side on the x axis) among the light incident on the focus F1 similarly as in the focus detection pixel 490.

Also, the irradiation light in the light distribution area A2 is incident on the first light receiving element 401 and the second light receiving element 402 similarly as in the focus detection pixel 490. However, in the focus detection pixel 410, the light incident on the light receiving element 401 is smaller than the light incident on the second light receiving element 402.

FIG. 5B is a graph illustrating an example of light receiving amounts of the positions of the first light receiving element 401 and the second light receiving element 402 (total amount of the irradiation lights). While the vertical axis is set as the light receiving amount, the graph in FIG. 5B indicates bar graphs representing a light receiving amount in the first light receiving element 401 (light receiving amount B4), a light receiving amount in the second light receiving element 402 (light receiving amount B5), and the total amount of the irradiation lights (irradiation amount B6) in the element separation area 403. Also, in this graph, as comparison targets of the light receiving amount B4, the light receiving amount B5, and the irradiation amount B6, the bar graphs representing the light receiving amount B1, the light receiving amount B2, and the irradiation amount B3 illustrated in FIG. 4B are illustrated.

Here, the light receiving amount of the focus detection pixel 410 will be described while being compared with the light receiving amount of the focus detection pixel 490.

The light receiving amount B4 indicates the light receiving amount of the first light receiving element 401 in the focus detection pixel 410. This light receiving amount B4 slightly decreases as compared with a light receiving amount in the first light receiving element 491 in the focus detection pixel 490 (light receiving amount B1). As illustrated in FIG. 5A, in the light receiving element 401, this decrease occurs as the light receiving amount of the irradiation light in the light distribution area A2 decreases.

The light receiving amount B5 indicates the light receiving amount of the second light receiving element 402 in the focus detection pixel 410. This light receiving amount B5 significantly increases as compared with the light receiving amount in the second light receiving element 492 (light receiving amount B2) in the focus detection pixel 490. As illustrated in FIG. 5A, this increase occurs as the irradiation light on the left half of the light distribution area A1 is received by the second light receiving element 492.

The irradiation amount B6 indicates the total amount of the irradiation lights in the element separation area 403. This irradiation amount B6 significantly decreases as compared with the total amount of the irradiation lights in the element separation area 493 (the irradiation amount B3). This decrease occurs while the second light receiving element 402 becomes adjacent to the axis L1, the second light receiving element 402 is irradiated with the irradiation light on the right half of the light distribution area A1.

In this manner, in the focus detection pixel 410, as the second light receiving element 402 is adjacent to the axis L1, the incident light from the left side of the micro lens 311 among the lights subjected to the pupil division can efficiently be incident on the light receiving element.

It should be noted that herein, the example has been described in which the axis L1 is located at the end portion on the side of the element separation area 403 of the second light receiving element 402, but the present invention is not limited to this. With regard to the first embodiment, it suffices as long as the positions of the first light receiving element 401 and the second light receiving element 402 are adjusted so that the second light receiving element 402 is irradiated with the light irradiated in the vicinity of the axis L1 of the light receiving plane (in the vicinity of the focus F1). That is, a case is conceivable in which the positions of the first light receiving element 401 and the second light receiving element 402 are adjusted so that the axis L1 is located between the center of the element separation area 403 and the end portion on the side of the element separation area 403 of the second light receiving element 402.

[Effect Example of the Focus Detection Pixel 410]

Figure 6A:
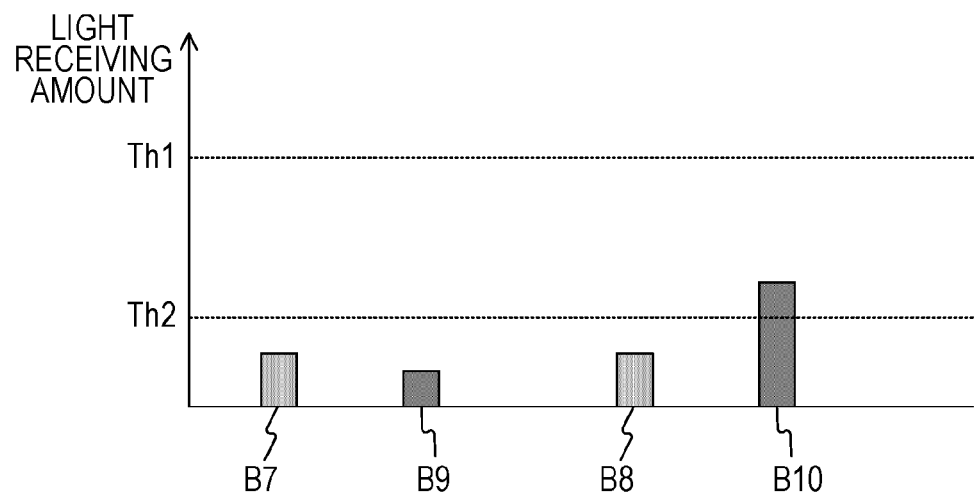
FIGS. 6A and 6B are schematic diagrams illustrating an effect of light reception by the focus detection element according to the first embodiment.
Figure 6B:
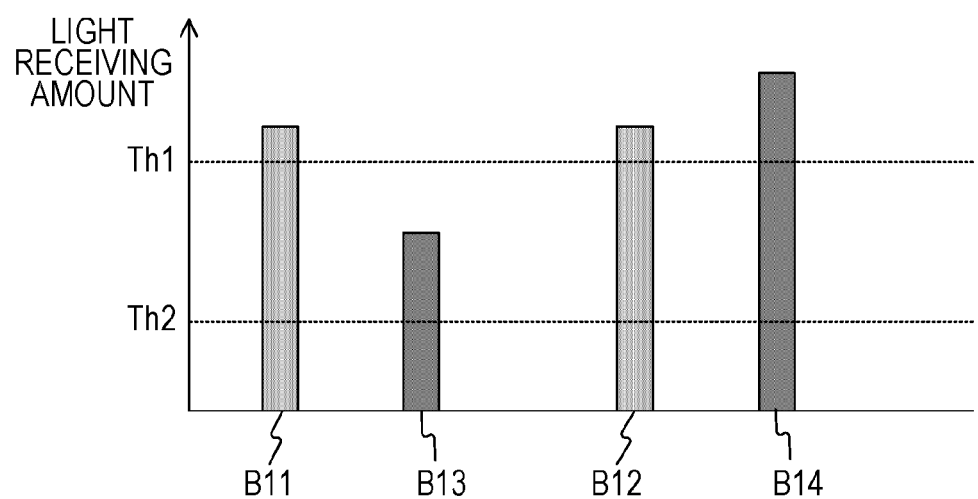

FIGS. 6A and 6B are schematic diagrams, illustrating an effect of the light reception by the focus detection pixel 410 according to the first embodiment.

FIG. 6A illustrates a graph representing examples of the light receiving amounts of the positions of the first light receiving element 401 and the second light receiving element 402 in a case where the light amount incident on the focus detection pixel 410 is small or low. The graph in FIG. 6A includes bar graphs representing a light receiving amount in the first light receiving element 401 (light receiving amount B9) and a light receiving amount in the second light receiving element 402 (light receiving amount B10) while the vertical axis is set as the light receiving amount. Also, this graph indicates the bar graphs representing a light receiving amount in the first light receiving element 491 (light receiving amount B7) and a light receiving amount in the second light receiving element 492 (light receiving amount B8) in a case where the same incident light is incident on the focus detection pixel 490 as comparison targets of the light receiving amounts B9 and B10.

In FIG. 6A, a state is supposed in which as the light amount incident on the focus detection pixel is small or low, the first light receiving element 491 and the second light receiving element 492 of the focus detection pixel 490 cannot generate electric signals.

The light receiving amount B7 indicates the light receiving amount in the first light receiving element 491 of the focus detection pixel 490. This light receiving amount B7 indicates that the light receiving amount in the first light receiving element 491 is a light receiving amount lower than a light amount for a weak light detection limit by the light receiving element (weak light detection limit Th2). The first light receiving element 491 at this light receiving amount outputs an electric signal indicating no light reception in the first light receiving element 491 as an electric signal cannot be generated in the case of a light receiving amount lower than or equal to the weak light detection limit Th2 (for example, "0" among 256-gradation electric signals).

The light receiving amount B8 indicates the light receiving amount in the second light receiving element 492 of the focus detection pixel 490. This light receiving amount B8 indicates that the light receiving amount in the second light receiving element 492 is a light receiving amount lower than the weak light detection limit Th2. The second light receiving element 492 at this light receiving amount outputs an electric signal indicating no light reception in the second light receiving element 492 similarly as in the first light receiving element 491 whose light receiving amount is the light receiving amount B7.

The light receiving amount B9 and the light receiving amount B10 indicate the light receiving amounts of the positions of the first light receiving element 401 and the second light receiving element 402 in the focus detection pixel 410. In these light receiving amount B9 and the light receiving amount B10, as described in FIGS. 5A and 5B, the light receiving amount in the second light receiving element 492 increases, and as a result, it is indicated that the light receiving amount of the second light receiving element 402 exceeds the weak light detection limit Th2. In this case, the light receiving element 401 outputs an electric signal indicating no light reception and outputs an electric signal indicating that the second light receiving element 492 receives the light (for example, "20" among the 256-gradation electric signals).

That is, in the focus detection pixel 490, even in a case where the incident light lower than the detection limit is irradiated, the focus detection pixel 410 can detect the light amount as the light receiving amount higher than the weak light detection limit Th2 exists in the second light receiving element 402.

FIG. 6B illustrates a graph representing examples of light receiving amounts at the positions of the first light receiving element 401 and the second light receiving element 402 in a case where the light amount incident on the focus detection pixel 410 is saturated. The graph in FIG. 6B indicates bar graphs representing a light receiving amount in the first light receiving element 401 (light receiving amount B13) and a light receiving amount in the second light receiving element 402 (light receiving amount B14) while the vertical axis is set as the light receiving amount. Also, this graph indicates bar graphs representing a light receiving amount in the first light receiving element 491 (light receiving amount B11) and a light receiving amount in the second light receiving element 492 (light receiving amount B12) in a case where the same indicant light is incident on the focus detection pixel 490 as comparison targets for the light receiving amounts B13 and B14.

The light receiving amount B11 indicates the light receiving amount in the first light receiving element 491 of the focus detection pixel 490. This light receiving amount B11 indicates that the light receiving amount in the first light receiving element 491 is a light receiving amount higher than the maximum light amount that can be detected by the light receiving element (saturation detection limit Th1). The first light receiving element 491 at this light receiving amount cannot detect a difference of the light receiving amount higher than or equal to the saturation detection limit Th1 and therefore outputs an electric signal indicating that the light reception in the first light receiving element 491 is maximum (for example, "255" among the 256-gradation electric signals).

The light receiving amount B12 indicates the light receiving amount in the second light receiving element 492 of the focus detection pixel 490. This light receiving amount B8 indicates that the light receiving amount in the second light receiving element 492 is a light receiving amount higher than the saturation detection limit Th1. The second light receiving element 492 at this light receiving amount outputs an electric signal indicating that the light receiving amount is the maximum light reception in the second light receiving element 492 similarly as in the first light receiving element 491 at the light receiving amount B11.

The light receiving amount B13 and the light receiving amount B14 indicate the light receiving amounts at the positions of the first light receiving element 401 and the second light receiving element 402 of the focus detection pixel 410. In the light receiving amount B13 and the light receiving amount B14, as described in FIGS. 5A and 5B, it is indicated that the light receiving amount in the second light receiving element 492 increases, and also the light receiving amount in the first light receiving element 491 decreases, and as a result, the light receiving amount of the first light receiving element 401 becomes lower than or equal to the saturation detection limit Th1.

That is, in the focus detection pixel 490, even in a case where the incident light higher than the detection limit is irradiated, in the light receiving element 401, the light receiving amount becomes lower than the saturation detection limit Th1, and the focus detection pixel 410 can detect a difference of the light amount.

[Light Receiving Example of Focus Detection Pixels 420 to 480]

FIGS. 7 to 9 are schematic drawings illustrating light receiving examples of the light amounts incident on the focus detection pixels 420 to 480 according to the first embodiment.

In these FIGS. 7 to 9, with regard to the focus detection pixels 420 to 480, a difference from the focus detection pixel 410 illustrated in FIG. 5A will be described.

Also, according to the first embodiment, in the focus detection pixels 410 to 490, the light receiving element proximal to the optical axis of the micro lens 311 is supposed to be the second light receiving element 402.

Figure 7A:
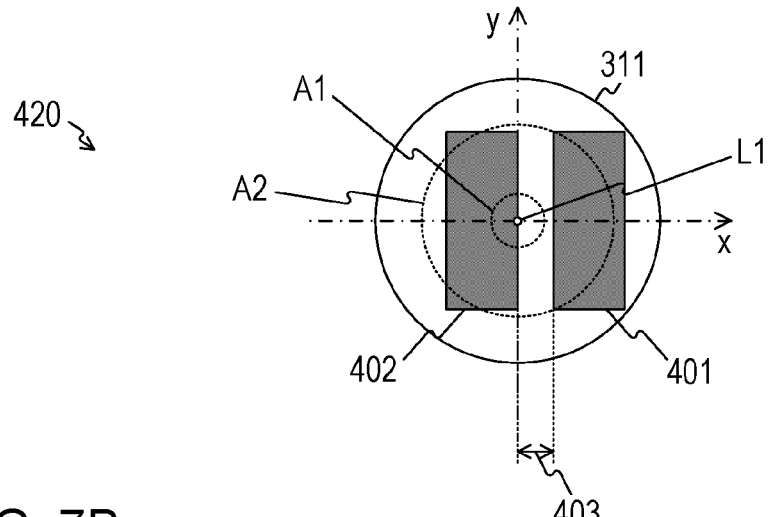
FIGS. 7A, 7B, and 7C are top views, schematically illustrating focus detection pixels according to the first embodiment.
Figure 7B:
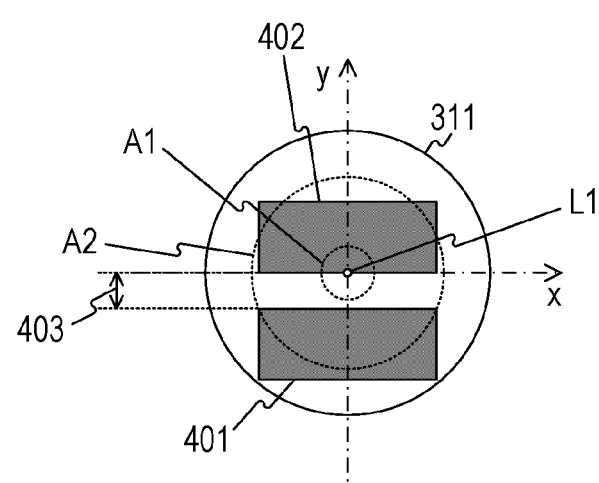
Figure 7C:
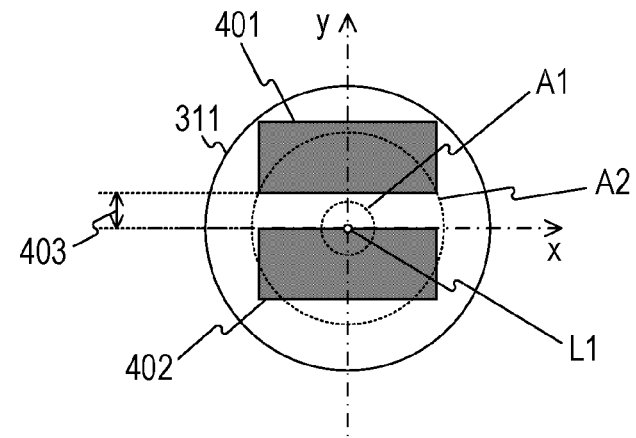

FIGS. 7A, 7B, and 7C are top views schematically illustrating the focus detection pixels 420 to 440 according to the first embodiment.

As illustrated in FIG. 7A, while the origin of the xy coordinates is set as the rotation center, the focus detection pixel 420 is obtained by rotating clockwise the focus detection pixel 410 illustrated in FIG. 5A by 180°. This focus detection pixel 420 can receive the light irradiated from the right side of the micro lens 311 (on the plus side on the x axis) on the left side of the light distribution area A1 (on the minus side on the x axis) in the second light receiving element 402. This focus detection pixel 420 can efficiently receive the lights subjected to the pupil division (lights divided on the plus side and the minus side on the x axis) in the left and right direction of the micro lens 311 while being used together with the focus detection pixel 410.

As illustrated in FIG. 7B, while the origin of the xy coordinates is set as the rotation center, the focus detection pixel 430 is obtained by rotating clockwise the focus detection pixel 410 illustrated in FIG. 5A by 270°. This focus detection pixel 430 can receive the light irradiated from the bottom side of the micro lens 311 (on the minus side on the y axis) to the top side of the light distribution area A1 (on the plus side on the y axis) in the second light receiving element 402.

As illustrated in FIG. 7C, while the origin of the xy coordinates is set as the rotation center, the focus detection pixel 440 is obtained by rotating clockwise the focus detection pixel 410 illustrated in FIG. 5A by 90°. This focus detection pixel 440 can efficiently receive the light irradiated from the top side of the micro lens 311 (on the plus side on the y axis) to the bottom side of the light distribution area A2 (on the minus side on the y axis with respect to the axis L1 on the focus plane) in the second light receiving element 402. This focus detection pixel 440 can efficiently receive the lights subjected to the pupil division in the up and down direction of the micro lens 311 (lights divided on the plus side and the minus side on the y axis) while being used together with the focus detection pixel 430.

Figure 8A:
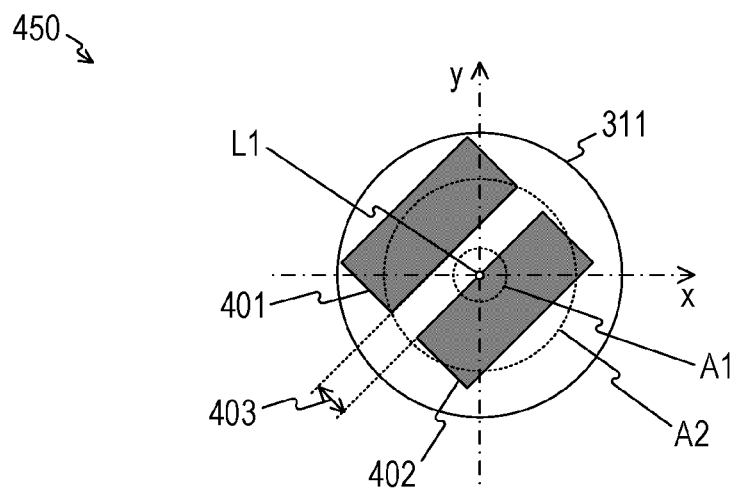
FIGS. 8A and 8B are top views schematically illustrating focus detection pixels according to the first embodiment.
Figure 8B:
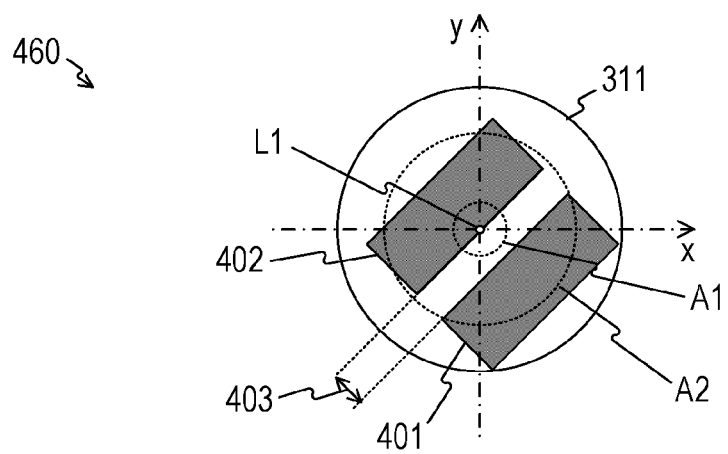

FIGS. 8A and 8B are top views schematically illustrating the focus detection pixels 450 and 460 according to the first embodiment.

As illustrated in FIG. 8A, while the origin of the xy coordinates is set as the rotation center, the focus detection pixel 450 is obtained by rotating clockwise the focus detection pixel 410 illustrated in FIG. 5A by 315°. This focus detection pixel 450 can receive the light irradiated from the lower right half of the micro lens 311 (bottom side of the areas divided by the light of y=x (on the minus side on the y axis)) to the upper left half of the light distribution area A1 (top side of the areas divided by the light of y=x) in the second light receiving element 402.

As illustrated in FIG. 8B, while the origin of the xy coordinates is set as the rotation center, the focus detection pixel 460 is obtained by rotating clockwise the focus detection pixel 410 illustrated in FIG. 5A by 135°. This focus detection pixel 460 can receive the light irradiated from the upper left half of the micro lens 311 (top side of the areas divided by the light of y=x) to the lower right half of the light distribution area A1 (bottom side of the areas divided by the light of y=x while the axis L1 is set as the center) in the second light receiving element 402. This focus detection pixel 460 can efficiently receive the lights subjected to the pupil division in the direction of the upper left and the lower right of the micro lens 311 (divided by the line of y=x) while being used together with the focus detection pixel 450.

Figure 9A:
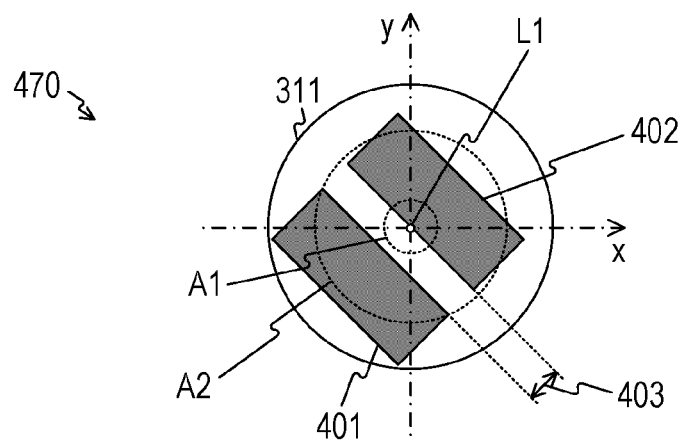
FIGS. 9A and 9B are top views schematically illustrating focus detection pixels according to the first embodiment.
Figure 9B:
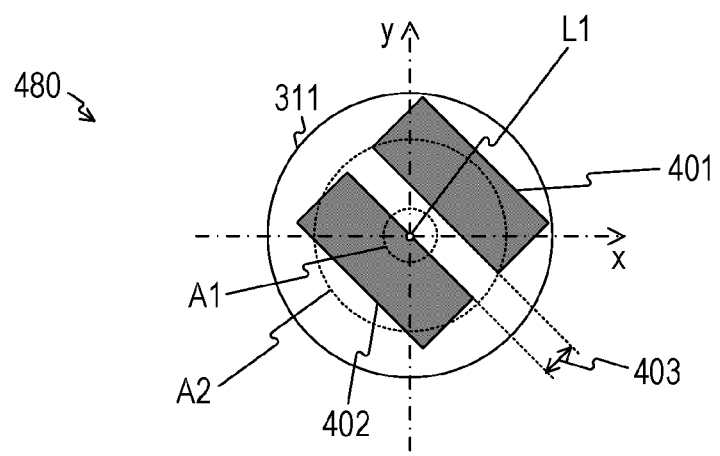

FIGS. 9A and 9B are top views schematically illustrating the focus detection pixels 470 and 480 according to the first embodiment.

As illustrated in FIG. 9A, while the origin of the xy coordinates is set as the rotation center, the focus detection pixel 470 is obtained by rotating clockwise the focus detection pixel 410 illustrated in FIG. 5A by 225°. This focus detection pixel 470 can receive the light irradiated from the lower left half of the micro lens 311 (the bottom side of the areas divided by the line of y=−x) to the upper right half of the light distribution area A1 (the top side of the areas divided by the line of y=−x) in the second light receiving element 402.

As illustrated in FIG. 9B, while the origin of the xy coordinates is set as the rotation center, the focus detection pixel 480 is obtained by rotating clockwise the focus detection pixel 410 illustrated in FIG. 5A by 45°. This focus detection pixel 480 can receive the light irradiated from the upper right half of the micro lens 311 (the top side of the areas divided by the line of y=−x) to the lower left half of the light distribution area A1 (the bottom side of the areas divided by the line of y=−x while the axis L1 is set as the center) in the second light receiving element 402. This focus detection pixel 480 can efficiently receive the lights subjected to the pupil division in the direction of the lower left and the upper right of the micro lens 311 while being used together with the focus detection pixel 470 (divided by the line of y=−x).

In this manner, for the focus detection pixels in the image sensor 200, the focus detection pixel 490 where the arrangement position in the focus detection pixels of a pair of light receiving elements is symmetric and the focus detection pixels 410 to 480 where the arrangement position in the focus detection pixels of a pair of light receiving elements is asymmetric are provided.

It should be noted that herein, the light receiving plane of the light receiving element is aligned with the focus plane of the micro lens 311, but the present invention is not limited to this. To accurately separate the incident light on the micro lens 311, the light receiving plane of the light receiving element may also be set rearward with respect to the focus plane.

[Arrangement Example of Focus Detection Pixels in Image Sensor]

Figure 10:
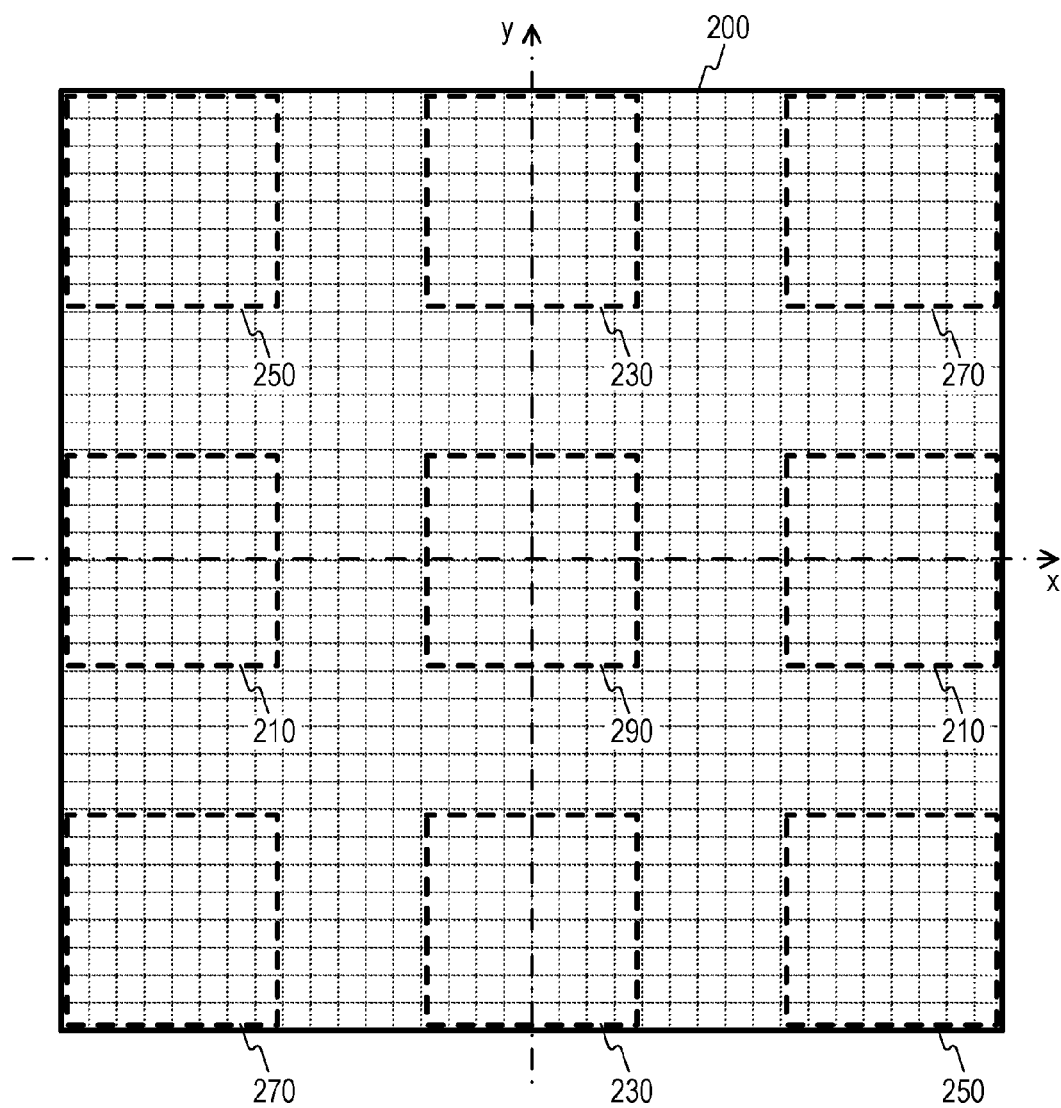
FIG. 10 is a schematic diagram illustrating an example of an area where the focus detection pixels are arranged in an image sensor according to the first embodiment.

FIG. 10 is a schematic diagram illustrating an example of an area where the focus detection pixels 410 to 490 are arranged in the image sensor 200 according to the first embodiment.

FIG. 10 illustrates the image sensor 200 and the focus detection areas 210, 230, 250, 270, and 290.

It should be noted that in FIGS. 10 to 14, a description will be given while the center of the image sensor 200 is set as the origin, xy axes are supposed in which the left and right direction is set as the x axis, and the up and down direction is set as the y axis.

The focus detection areas 210, 230, 250, 270, and 290 are areas indicating examples of areas where the focus detection pixels 410 to 490 are arranged. In this focus detection area, the image pickup pixel 310 and any of the focus detection pixels 410 to 490 are arranged in a predetermined pattern. Also, in an area except for the focus detection area of the image sensor 200, only the image pickup pixel 310 is arranged.

These focus detection areas 290, 210, 230, 250, and 270 will be described in detail by using FIGS. 11 to 14.

Figure 11:
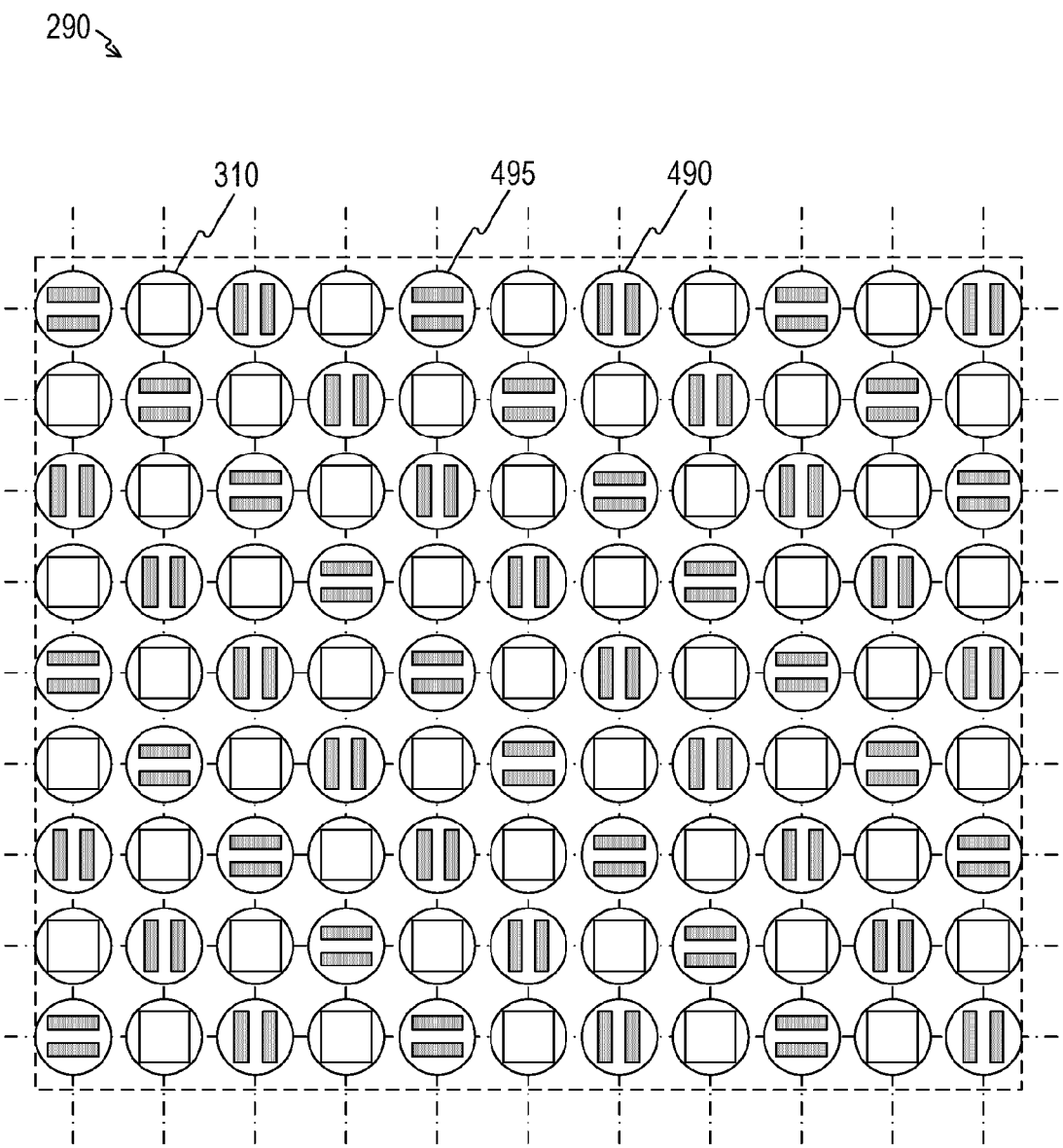
FIG. 11 is a schematic diagram illustrating an example of a pixel arrangement in a focus detection area according to the first embodiment.

FIG. 11 is a schematic view illustrating an example of a pixel arrangement in the focus detection area 290 according to the first embodiment.

It should be noted that in this FIG. 11 and subsequent figures, one obtained by rotating clockwise the focus detection pixel 490 by 90° will be referred to as focus detection pixel 495.

The focus detection area 290 is an area where the focus detection pixels area arranged in the vicinity of the center of the image sensor 200. In this focus detection area 290, for example, as illustrated in FIG. 11, the image pickup pixels 310 and the focus detection pixels 490 and 495 are arranged in a predetermined pattern. This pattern is a pattern in which the image pickup pixels 310 are arranged so that the focus detection pixels 490 and 495 can store image pickup data of the arranged pixels. This predetermined pattern is a pattern in which, for example, as illustrated in FIG. 11, the image pickup pixels 310 are arranged on the top, bottom, left, and right of the focus detection pixels 490 and 495.

Figure 12:
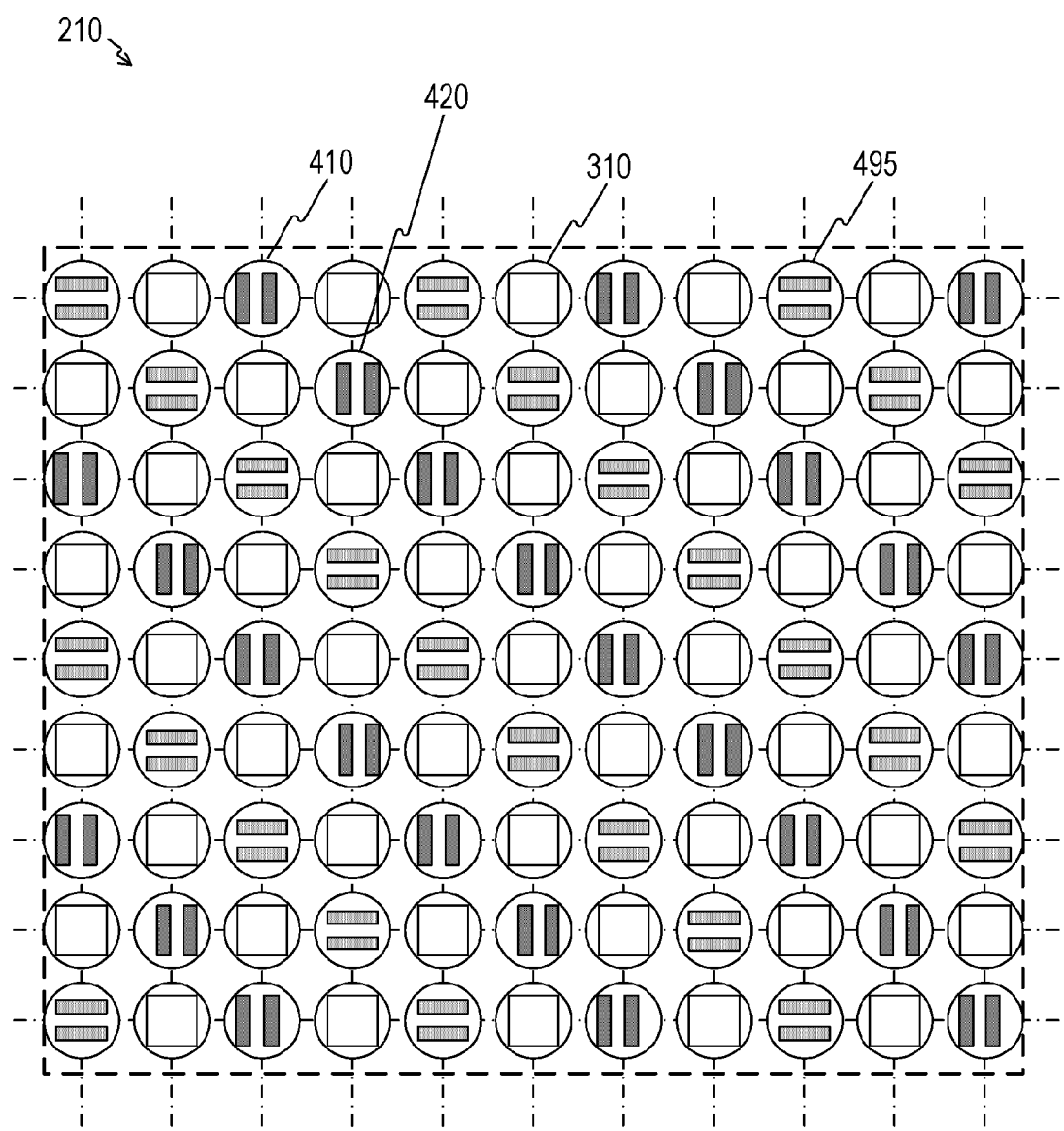
FIG. 12 is a schematic diagram illustrating an example of a pixel arrangement in a focus detection area according to the first embodiment.

FIG. 12 is a schematic diagram illustrating an example of a pixel arrangement in the focus detection area 210 according to the first embodiment.

The focus detection area 210 is an area where the focus detection pixels in the vicinity of the center in the left end and the center in the right end of the image sensor 200 are arranged. In this focus detection area 210, for example, as illustrated in FIG. 12, the image pickup pixels 310 and the focus detection pixels 410, 420, and 495 are arranged in a pattern similar to FIG. 11. Also, in this focus detection area 210, the focus detection pixels 410 and 420 that are the focus detection pixels where the positions of one pair of the light receiving elements are mutually different by 180 degrees are arranged are adjacently arranged.

Figure 13:
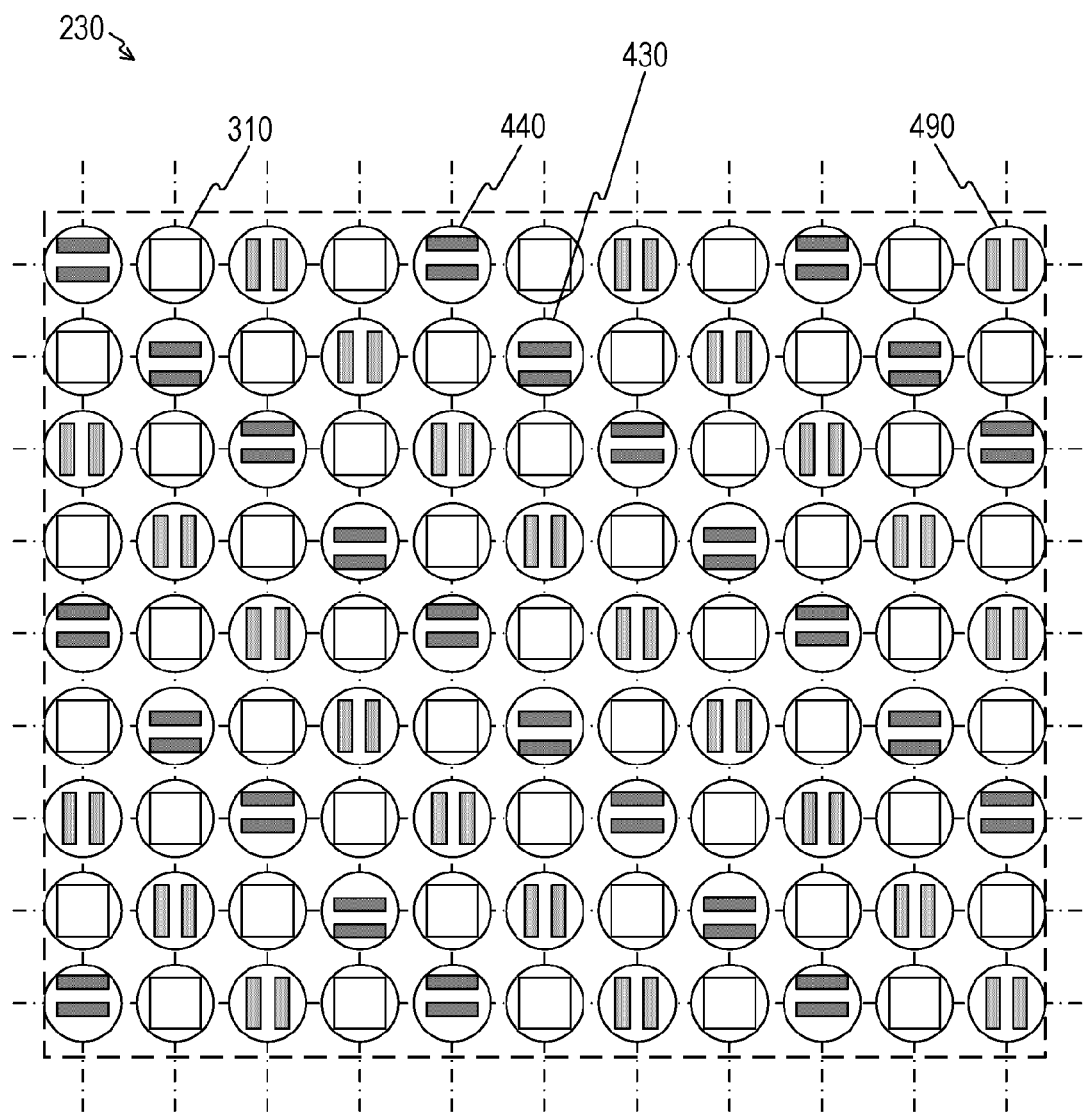
FIG. 13 is a schematic diagram illustrating an example of a pixel arrangement in a focus detection area according to the first embodiment.

FIG. 13 is a schematic view illustrating an example of a pixel arrangement in the focus detection area 230 according to the first embodiment.

The focus detection area 230 is an area where the focus detection pixels in the vicinity of the center in the upper end and the center in the lower end of the image sensor 200 are arranged. In this focus detection area 230, for example, as illustrated in FIG. 13, the image pickup pixels 310 and the focus detection pixels 430, 440, and 490 are arranged in a pattern similar to FIG. 11. Also, in this focus detection area 230, the focus detection pixels 430 and 440 that are the focus detection pixels where the positions of one pair of the light receiving elements are mutually different by 180 degrees are adjacently arranged.

Figure 14:
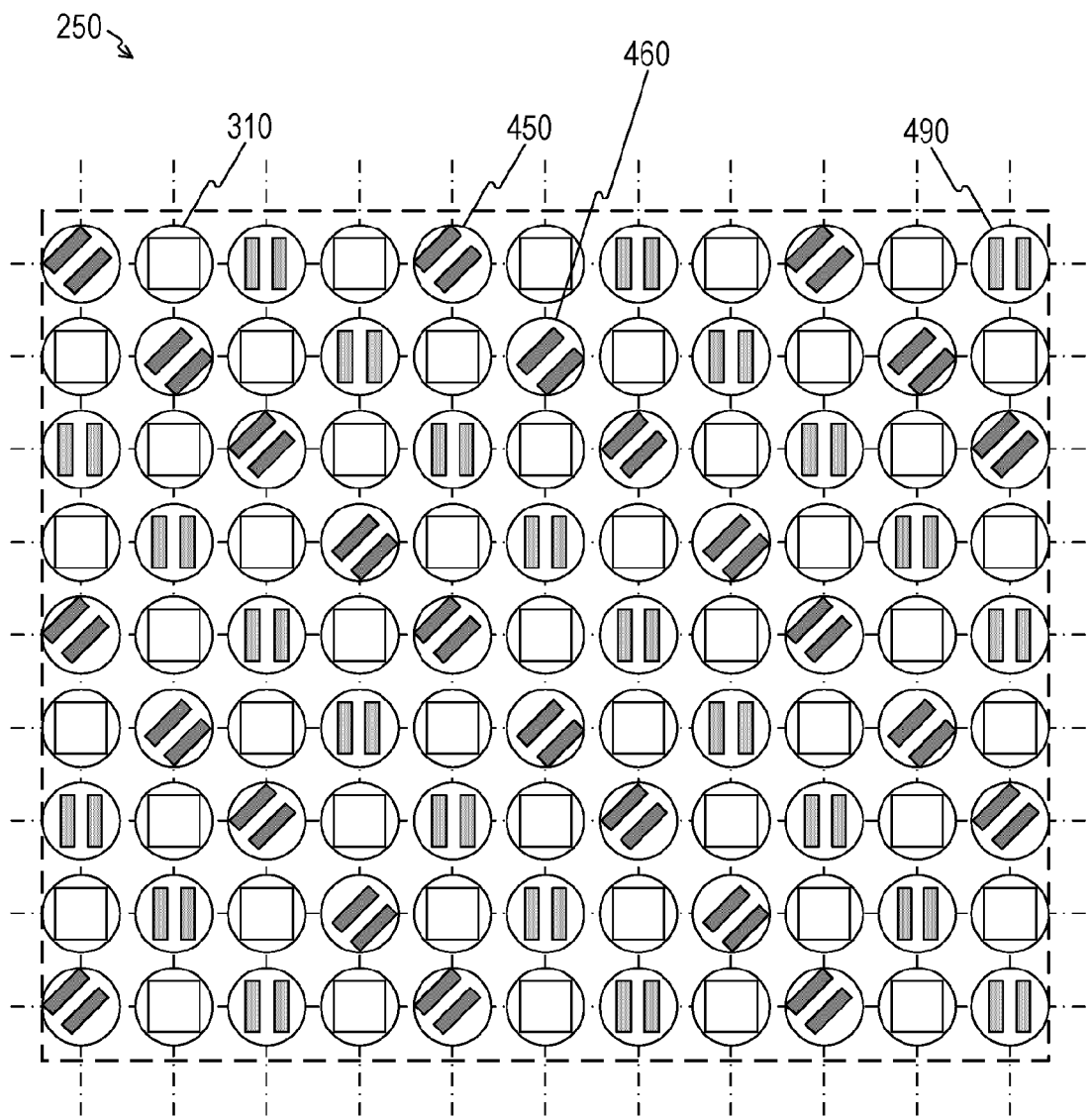
FIG. 14 is a schematic diagram illustrating an example of a pixel arrangement in a focus detection area according to the first embodiment.

FIG. 14 is a schematic view illustrating an example of a pixel arrangement in the focus detection area 250 according to the first embodiment.

The focus detection area 250 is an area where the focus detection pixels in the vicinity of the left end in the upper end and the right end of the upper end of the image sensor 200 are arranged. In this focus detection area 250, for example, as illustrated in FIG. 14, the image pickup pixels 310 and the focus detection pixels 450, 460, and 490 are arranged in a pattern similar to FIG. 11. Also, in this focus detection area 250, the focus detection pixels 450 and 460 that are the focus detection pixels where the positions of one pair of the light receiving elements are mutually different by 180 degrees are adjacently arranged.

Figure 15:
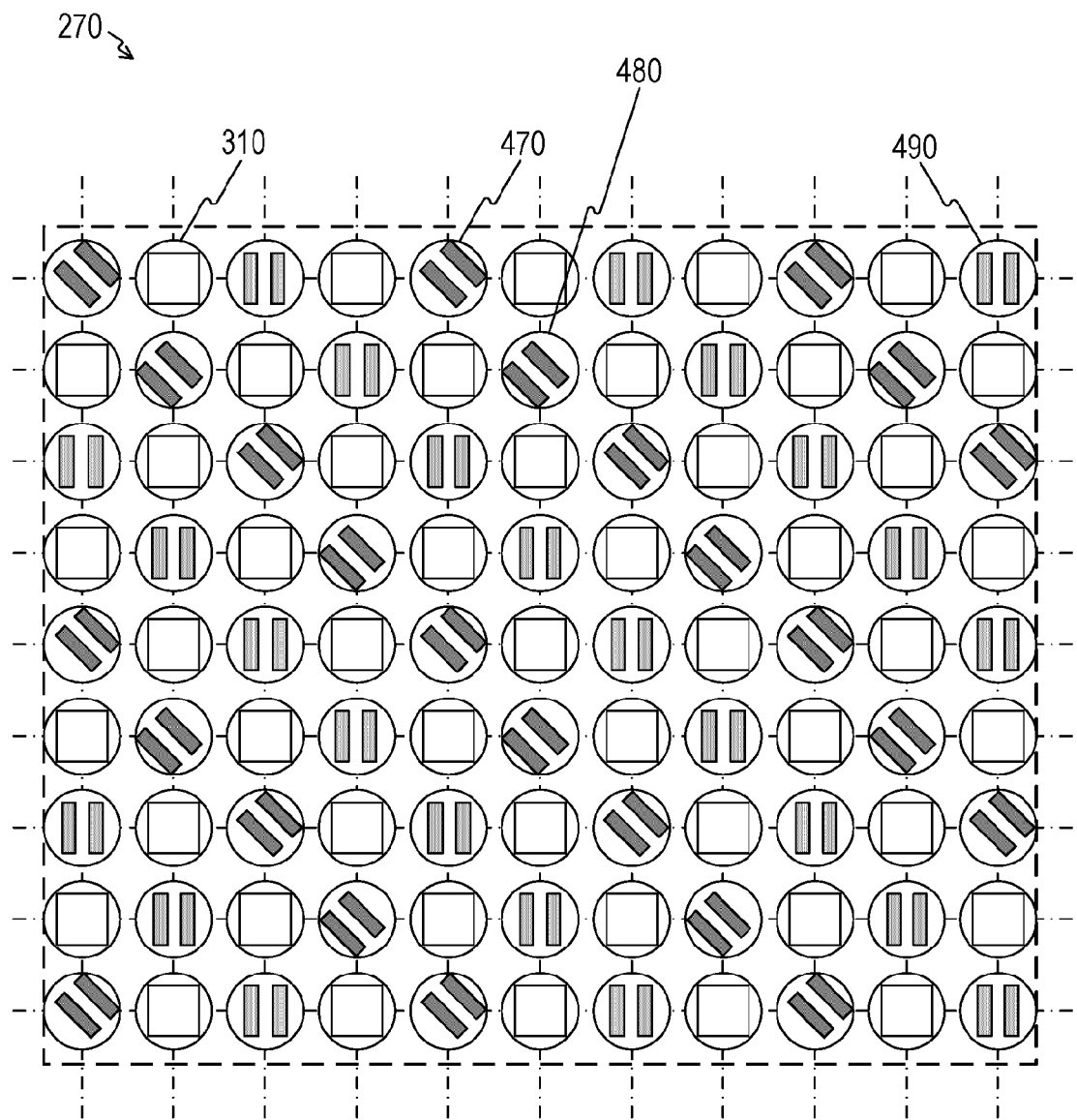
FIG. 15 is a schematic diagram illustrating an example of a pixel arrangement in a focus detection area according to the first embodiment.

FIG. 15 is a schematic view illustrating an example of a pixel arrangement in the focus detection area 270 according to the first embodiment.

The focus detection area 270 is an area where the focus detection pixels in the vicinity of the right end in the upper end and the left end in the lower end of the image sensor 200 are arranged. In this focus detection area 270, for example, as illustrated in FIG. 15, the image pickup pixels 310 and the focus detection pixels 470, 480, and 490 are arranged in a pattern similar to FIG. 11. Also, in this focus detection area 270, the focus detection pixels 470 and 480 that are the focus detection pixels where the positions of one pair of the light receiving elements are mutually different by 180 degrees are adjacently arranged.

In this manner, in accordance with the direction of the pupil division, by arranging the focus detection pixels 410 to 490 in the image sensor 200, the first light receiving element 491 and the second light receiving element 492 can be efficiently irradiated with the light.

It should be noted that according to the first embodiment, the focus detection areas 210, 230, 250, 270, and 290 are illustrated as an example of the area where the focus detection pixels are arranged, but the present invention is not limited to this. Any arrangement of the focus detection pixels may suffice as long as the shift of the focus can be detected, and, for example, a case of the arrangement in line in the x axis direction and the y axis direction is also conceivable.

[Phase Difference Detection Example]

FIGS. 16 to 19 are schematic diagrams illustrating phase difference detection examples according to the first embodiment. In these FIGS. 16 to 19, for the sake of convenience, a description will be given while the image sensor 200 is supposed in which the focus detection pixels 410 and 420 are alternately arranged horizontally in line (for example, the x axis direction illustrated in FIG. 10) as the focus detection pixels. Also, in the examples illustrated in FIGS. 16 to 19, it is supposed that a light source (subject) exists at the center of the image sensor 200.

Figure 16:
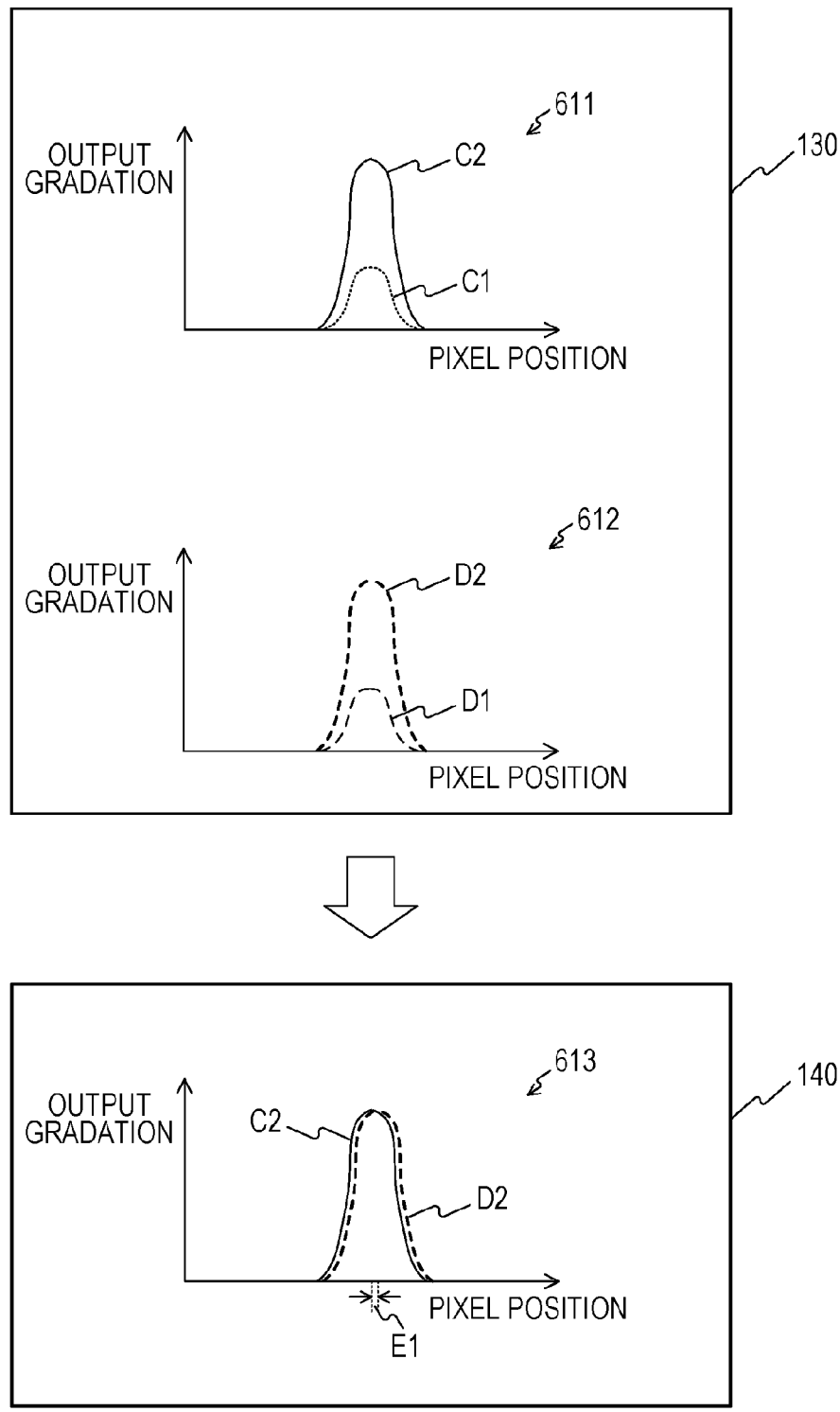
FIG. 16 illustrates a phase difference detection example at the time of in-focus according to the first embodiment.

FIG. 16 illustrates a phase difference detection example at the time of in-focus according to the first embodiment. In this drawing, a flow until the control unit 140 detects the shift of the focus on the basis of image data for focus adjustment generated from focus adjustment signals of the focus detection pixels 410 and 420 will be schematically described.

First, image data for focus adjustment that is generated by the signal processing unit 130 will be described.

Image data 611 is a graph schematically illustrating image data generated from the focus adjustment signal from the focus detection pixel 410. In this image data 611, the horizontal axis is set as a pixel position of the focus detection pixel 410 in the image sensor, and the vertical axis represents image data for focus adjustment having a gradation indicating an intensity of the focus adjustment signal of the focus detection pixel 410. This image data 611 indicates first light receiving element image data C1 and second light receiving element image data C2.

The first light receiving element image data C1 is image data generated on the basis of the focus adjustment signal supplied by the light receiving element 401 of the focus detection pixel 410 (light receiving element located on the minus side on the x axis). That is, this first light receiving element image data C1 indicates an intensity distribution in the image sensor for the light incident from the right side of the micro lens 311 (right side on the x axis of the micro lens 311 illustrated in FIG. 5A). In FIG. 16, because of the in-focus state, the light from the subject is received by the light receiving element 401 of the focus detection pixel 410 located in the vicinity of the center of the image sensor, and the focus adjustment signal is generated on the basis of the amount of the received light.

The second light receiving element image data C2 is image data generated on the basis of the focus adjustment signal supplied by the second light receiving element 402 of the focus detection pixel 410 (light receiving element located on the plus side on the x axis). That is, this second light receiving element image data C2 indicates an intensity distribution in the image sensor for the light incident from the left side of the micro lens 311 (left side on the x axis of the micro lens 311 illustrated in FIG. 5A). In FIG. 16, because of the in-focus state, similarly as in the first light receiving element image data C1, the light from the subject is received by the second light receiving element 402 of the focus detection pixel 410 located in the vicinity of the center of the image sensor, and the focus adjustment signal is generated on the basis of the amount of the received light. Also, as described in FIG. 5, the focus adjustment signal having a larger gradation than the focus adjustment signal of the light receiving element 401 is generated by the second light receiving element 402.

Image data 612 is a graph schematically illustrating image data generated from the focus adjustment signal from the focus detection pixel 420. In this image data 612, the horizontal axis is set as a pixel position of the focus detection pixel 420 in the image sensor, and the vertical axis represents image data for focus adjustment having a gradation indicating an intensity of the focus adjustment signal of the focus detection pixel 420. This image data 612 indicates first light receiving element image data D1 and second light receiving element image data D2.

The first light receiving element image data D1 is image data generated on the basis of the focus adjustment signal supplied by the light receiving element 401 of the focus detection pixel 420 (light receiving element located on the plus side on the x axis). That is, this first light receiving element image data D1 indicates an intensity distribution in the image sensor for the light incident from the left side of the micro lens 311. In this FIG. 16, because of the in-focus state, the light from the subject is received by the light receiving element 401 of the focus detection pixel 420 located in the vicinity of the image sensor, and the focus adjustment signal is generated on the basis of the amount of the received light.

The second light receiving element image data D2 is image data generated on the basis of the focus adjustment signal supplied by the second light receiving element 402 of the focus detection pixel 420 (light receiving element located on the minus side on the x axis). That is, this second light receiving element image data D2 indicates an intensity distribution in the image sensor for the light incident from the right side of the micro lens 311. In this FIG. 16, because of the in-focus state, similarly as in the first light receiving element image data D1, the light from the subject is received by the second light receiving element 402 of the focus detection pixel 420 located in the vicinity of the image sensor, and the focus adjustment signal is generated on the basis of the amount of the received light. Also, as described in FIGS. 5A and 5B, the focus adjustment signal having a larger gradation than the focus adjustment signal of the light receiving element 401 is generated by the second light receiving element 402.

Also, as the focus detection pixels 410 and 420 are alternately arranged horizontally in line, the first light receiving element image data C1 and the first light receiving element image data D1 have substantially the same image position. Similarly, the second light receiving element image data C2 and the second light receiving element image data D2 have substantially the same image position.

In this manner, the signal processing unit 130 generates four pieces of image data for focus adjustment on the basis of the focus adjustment signals from the focus detection pixel 410 and the focus detection pixel 420. Then, this signal processing unit 130 supplies the generated four pieces of image data for focus adjustment to the control unit 140.

Next, an example of a focus detection in the control unit 140 will be described.

Focus detection comparison image data 613 is a graph schematically illustrating two pieces of image data compared when the focus detection is performed. In this focus detection comparison image data 613, the horizontal axis is set as pixel positions of the focus detection pixel 410 and the focus detection pixel 420 in the image sensor, and the vertical axis represents image data for focus adjustment having a gradation indicating an intensity of the focus adjustment signal. This focus detection comparison image data 613 indicates two pieces of image data to be compared in the focus detection (the second light receiving element image data C2 and the first light receiving element image data D2).

Here, an operation of the control unit 140 will be described with reference to the focus detection comparison image data 613. First, the control unit 140 selects the two pieces of image data for focus adjustment from the four pieces of image data for focus adjustment supplied from the signal processing unit 130. That is, as this control unit 140 performs the phase difference detection, the intensity distribution of the light incident from the right side of the micro lens 311 and the intensity distribution of the light incident from the left side of the micro lens 311 are selected one each. This control unit 140 can accurately detect the difference of the focus by using the focus adjustment image data where strength and weakness of the signal are clear. For this reason, the control unit 140 selects the image data for focus adjustment having the strong signal (the second light receiving element image data C2 and the first light receiving element image data D2) among the four pieces of image data for focus adjustment.

Then, the control unit 140 detects a shift of images between the second light receiving element image data D2 and the second light receiving element image data C2 (image interval E1). It should be noted that in FIG. 16, because of the in-focus state, the image interval E1 becomes an interval and a positional relation between the position of the second light receiving element 402 of the focus detection pixel 410 which receives the strongest light amount and the light receiving element 401 of the focus detection pixel 420 which receives the strongest light amount.

The control unit 140 determines that the current state is the in-focus state on the basis of the image interval E1 and supplies a signal for maintaining the position of the image pickup lens in the lens unit 110 to the drive unit 150.

FIG. 17 illustrates a phase difference detection example at the time of back focus according to the first embodiment.

Here, a description will be given while the light amount from the subject is supposed to be the same as that of FIG. 16. That is, a state except for the difference of the focus adjustment signal caused by the back focus is the same as FIG. 16.

Image data 621 is equivalent to the focus detection pixel 410 image data 611 in FIG. 16, and image data 622 is equivalent to the image data 612 in FIG. 16. Also, focus detection comparison image data 623 is equivalent to the focus detection comparison image data 613 in FIG. 16.

In this FIG. 17, a difference from the in-focus state illustrated in FIG. 16 will be described.

First, image data of the light receiving element that receives the light incident from the left side of the image pickup lens will be described. In FIG. 17, because of the back focus, the light incident from the left side of the image pickup lens is received after further proceeding on the right side than at the time of in-focus. That is, the image data by the second light receiving element 402 of the focus detection pixel 410 (the second light receiving element image data C2 in FIG. 17) becomes like image data obtained by shifting the image data at the time of in-focus (the second light receiving element image data C2 in FIG. 16) to the right. Similarly, the image data by the light receiving element 401 of the focus detection pixel 420 (the first light receiving element image data D1 in FIG. 17) becomes like image data obtained by shifting the image data at the time of in-focus (the first light receiving element image data D1 in FIG. 16) to the right.

Subsequently, image data of the light receiving element that receives the light incident from the right side of the image pickup lens will be described. In FIG. 17, because of the back focus, the light incident from the right side of the image pickup lens is received after further proceeding on the left side than at the time of in-focus. That is, the image data by the light receiving element 401 of the focus detection pixel 410 (the first light receiving element image data C1) becomes like image data obtained by shifting the image data at the time of in-focus to the left. Also, the image data by the second light receiving element 402 of the focus detection pixel 410 (the second light receiving element image data C2) becomes like image data obtained by shifting the image data at the time of in-focus to the left.

Next, the focus detection in the control unit 140 will be simply described. First, the control unit 140 selects the two pieces of image data for focus adjustment (the second light receiving element image data C2 and the first light receiving element image data D2) similarly as in FIG. 16. Then, this control unit 140 decides the movement amount of the image pickup lens on the basis of the shift of the images between the second light receiving element image data D2 and the second light receiving element image data C2 (image interval E2) and supplies a signal for moving the image pickup lens to the drive unit 150.

FIG. 18 illustrates a phase difference detection example when the amount of light is low or small according to the first embodiment.

Herein, similarly as in FIG. 6A, it is supposed that the light amount cannot be detected by the light receiving element 401, but the light amount can be detected by the second light receiving element 402.

Also, this FIG. 18 is the same as FIG. 17 except for the signal intensity in the image data for focus adjustment. Image data 631 is equivalent to the image data 621 of FIG. 17, and image data 632 is equivalent to the image data 622 of FIG. 17. Also, focus detection comparison image data 633 is equivalent to the focus detection comparison image data 623 of FIG. 16.

As illustrated in this FIG. 18, even in a case where the light cannot be detected by the focus detection pixel 410 and the light receiving element 401 of the focus detection pixel 420, the phase difference detection can be performed on the basis of the signals of the focus detection pixel 410 and the second light receiving element 402 of the focus detection pixel 420.

Figure 19:
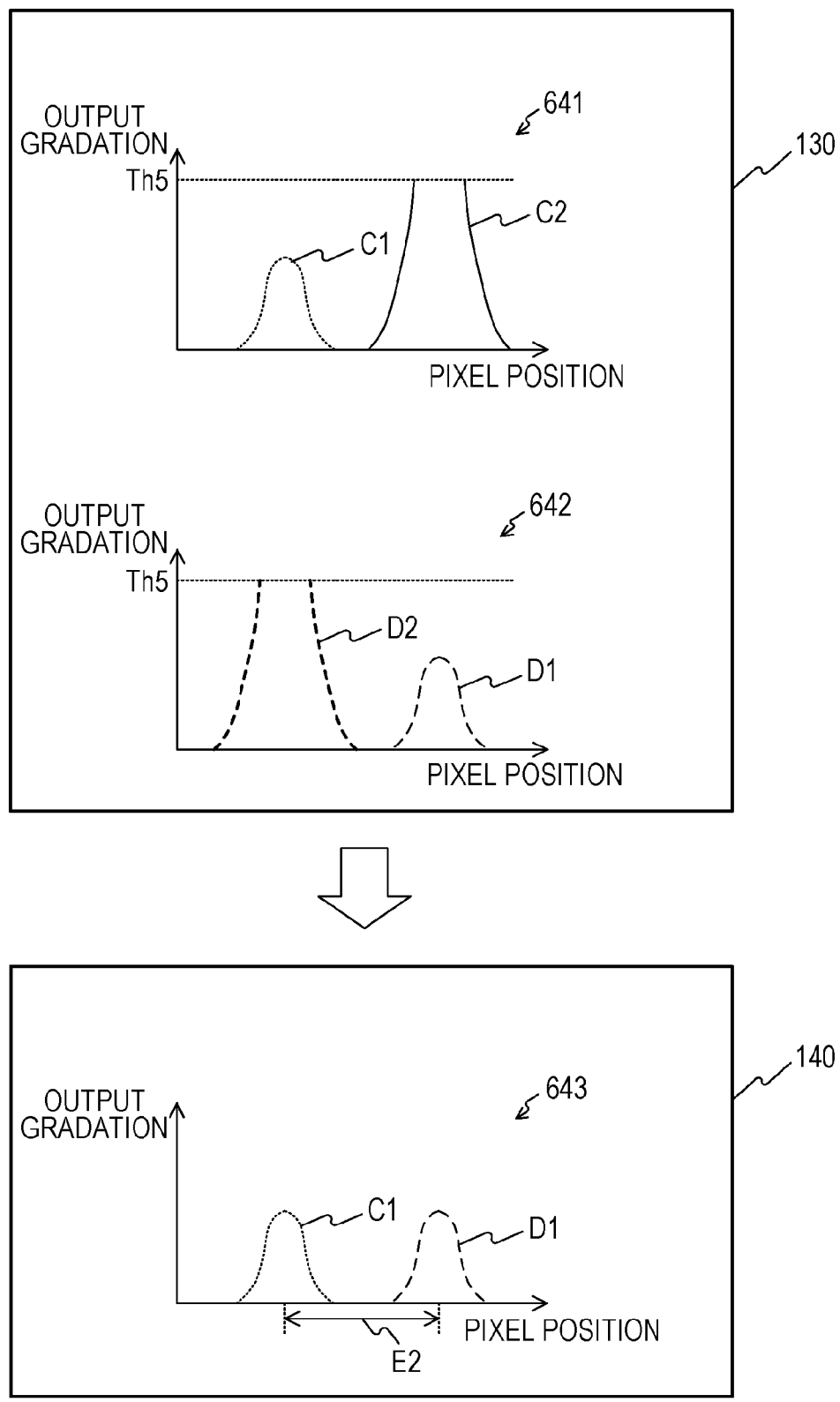
FIG. 19 illustrates a phase difference detection example at the time of saturation of the light amount according to the first embodiment.

FIG. 19 illustrates a phase difference detection example at the time of light amount saturation according to the first embodiment.

Herein, similarly as in FIG. 6B, it is supposed that in the second light receiving element 402, the light receiving amount is saturated (a large part of strength and weakness of the light amount cannot be detected), but in the light receiving element 401, the light receiving amount is not saturated (the strength and weakness of the light amount can be detected).

Also, this FIG. 19 is the same as FIG. 17 except for the signal intensity in the image data for focus adjustment. Image data 641 is equivalent to the image data 621 of FIG. 17, and image data 642 is equivalent to the image data 622 of FIG. 17. Also, focus detection comparison image data 643 is equivalent to the focus detection comparison image data 623 of FIG. 17.

As represented by the second light receiving element image data C2 and the first light receiving element image data D2 of this FIG. 19, in the image data for focus adjustment where a large part of the signals has the maximum value (signal upper limit value Th5), the difference of the signals in the image data for focus adjustment is decreased. According to this, a problem occurs that it is difficult to detect the shift of the images.

In view of the above, in a case where saturation of the light receiving amount occurs in the image data for focus adjustment of the second light receiving element 402, the control unit 140 selects the image data for focus adjustment of the light receiving element 401 with the small light receiving amount (the first light receiving element image data C1 and the first light receiving element image data D1). Then, this control unit 140 decides the movement amount of the image pickup lens on the basis of the shift of the images between the first light receiving element image data C1 and the first light receiving element image data D1 (the image interval E2) and supplies a signal for moving the image pickup lens to the drive unit 150.

As illustrated in this FIG. 19, in the focus detection pixel 410 and the second light receiving element 402 of the focus detection pixel 420, even in a case where the light receiving amount is saturated, it is possible to perform the phase difference detection on the basis of the signals of the focus detection pixel 410 and the light receiving element 401 of the focus detection pixel 420.

[Operation Example of Control Unit]

Next, an operation of the image pickup apparatus 100 will be described with reference to the drawings according to the first embodiment.

FIG. 20 is a flow chart illustrating a focus control procedure by the image pickup apparatus 100 according to the first embodiment.

In FIG. 20, a procedure from the start of the focus control in a case where image pickup of the subject is performed to the end of the focus control due to in-focus will be described. Also, herein, a case is supposed for description in which the light is picked up at such an intensity that the signal adjustment signal of one of the first light receiving element and the second light receiving element can be used.

First, the subject is picked up by the focus detection pixels in the image sensor 200, and a focus adjustment signal is generated (step S901). Subsequently, on the basis of the focus adjustment signal, image data for focus adjustment (image data) is generated by the signal processing unit 130 (step S902). It should be noted that step S901 is an example of image pickup means described in the scope of claims.

Next, the control unit 140 determines whether among the generated image data for focus adjustment, the image data for focus adjustment generated from the focus adjustment signal of the second light receiving element can be used for the calculation of the image interval (step S903). Then, in a case where it is determined that the image data for focus adjustment by the second light receiving element cannot be used (step S903), the image data for focus adjustment generated from the focus adjustment signal of the first light receiving element is selected by the control unit 140 (step S905). Herein, the case in which it is determined that the image data for focus adjustment by the second light receiving element cannot be used, for example, as illustrated in FIG. 19, means a case in which the light receiving amount is saturated in the second light receiving element 402. Then, on the basis of the selected image data for focus adjustment by the first light receiving element, the image interval is calculated (step S906).

On the other hand, in a case where it is determined that the image data for focus adjustment generated from the focus adjustment signal of the second light receiving element can be used (step S903), the image data for focus adjustment of the second light receiving element is selected by the control unit 140 (step S904). Then, on the basis of the selected image data for focus adjustment of the second light receiving element, the image interval is calculated (step S906).

Next, it is determined by the control unit 140 whether focusing is effected on the basis of the calculated image interval (step S907). Then, in a case where it is determined that focusing is not effected (step S907), the drive amount of the image pickup lens (movement amount) in the lens unit 110 is calculated by the control unit 140 (step S908). Subsequently, the image pickup lens in the lens unit 110 is driven by the drive unit 150 (step S909), and the flow returns to step S901. It should be noted that step S907 is an example of determination means described in the scope of claims.

On the other hand, in a case where it is determined that focusing is effected (step S907), the focus control procedure is ended.

In this manner, according to the first embodiment, to set the axis L1 to be proximate to the second light receiving element 492, by adjusting the positions of the pair of the light receiving elements, it is possible to accurately perform the focus adjustment.

<2. Second Embodiment>

According to the first embodiment, to set the example has been described in which the optical axis of the micro lens to be proximate to one of the pair of the light receiving elements, the positions in the focus detection pixel of the pair of the light receiving elements are adjusted. In this case, a general-use micro lens array where micro lenses are arranged at an even interval can be used.

On the other hand, setting the optical axis of the micro lens to be proximate to one of the pair of the light receiving elements can also be performed by adjusting the position of the micro lens with respect to the focus detection pixel. In view of the above, according to the second embodiment, an example of adjusting the position of the micro lens with respect to the focus detection pixel will be described.

[Configuration Example of Focus Detection Pixel]

Figure 21A:
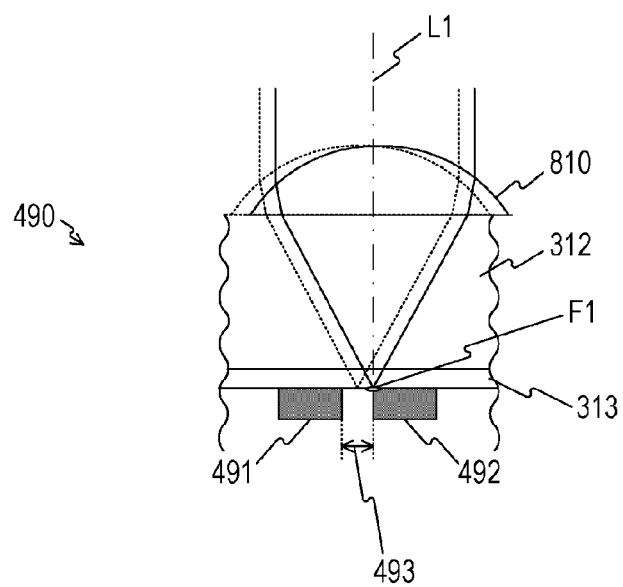
FIG. 21A is a cross sectional view and FIG. 21B is a top view schematically illustrating an example of a focus detection pixel according to a second embodiment.
Figure 21B:
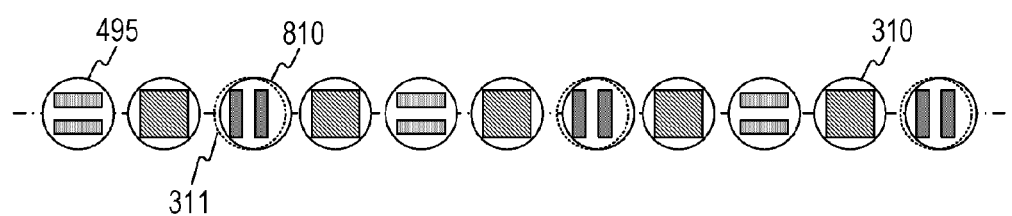

FIG. 21A is a cross sectional view and FIG. 21B is a top view schematically illustrating an example of a focus detection pixel according to the second embodiment. FIGS. 21A and 21B illustrate a cross sectional configuration and a top view, respectively, of the focus detection pixel 490 provided with a micro lens 810 as a focus detection pixel equivalent to the focus detection pixel 410 illustrated in FIG. 3B as an example.

FIG. 21A schematically illustrates a cross sectional configuration of the focus detection pixel 490 provided with the micro lens 810 according to the second embodiment.

According to this second embodiment, configurations except for the micro lens 810 are the same as the configurations of the focus detection pixel 490 illustrated in FIG. 3A, and a description thereof with respect to FIGS. 21A and 21B will be omitted. Also, FIG. 21A illustrates the position of the micro lens 311 illustrated in FIG. 3A and the range R1 incident light by broken lines as the comparison target.

The micro lens 810 is configured to collect the light incident on the image pickup pixel 490 similarly as in the micro lens 311. This micro lens 810 is arranged so that the axis (L1) passing through the center of the micro lens 810 is located at the end position on the side of the element separation area 493 of the second light receiving element 492. That is, the axis L1 of this micro lens 810 does not pass through the center position of the focus detection pixel 490.

FIG. 21B is a top view illustrating a positional relation between the micro lens 810 and the focus detection pixel 490 according to the second embodiment. This FIG. 21B illustrates a part of a focus detection area according to the second embodiment. It should be noted that this FIG. 21B illustrates positions of the micro lens 311 illustrated in FIG. 3A by a broken line as the comparison target.

Here, a description will be given while paying attention to the position of the micro lens 810. As compared with the micro lens 311 provided to the focus detection pixel 490 illustrated according to the first embodiment, the micro lens 810 is shifted in the right direction. According to this, in the focus detection pixel 490, although the center of pixel of the focus detection pixel 490 and the center of the separation area 493 are the same, as the position of the micro lens is shifted, the pair of the light receiving elements becomes asymmetric with respect to the axis L1.

In this manner, this FIG. 21B illustrates that by adjusting the position of the micro lens 311 of the focus detection pixel 490 (broken line in FIG. 21B) (moving to the right), the effect similar to the focus detection pixel 410 can be attained.

In this manner, according to the second embodiment, by adjusting the position of the micro lens with respect to the focus detection pixel, similarly as in the first embodiment, it is possible to efficiently irradiate the light receiving element with one incident light among the lights subjected to the pupil division.

<3. Third Embodiment>

According to the first embodiment and the second embodiment, the example has been described in which the irradiation light on the second light receiving element is increased. The focus detection pixel described thus far generates two focus adjustment signals as one focus detection pixel is provided with the pair of the light receiving elements. For that reason, by devising a reading out method for these two focus adjustment signals, the speed of the focus control can be improved. In view of the above, according to a third embodiment, an example will be described in which a second signal line used only for reading out one focus adjustment signal among the two focus adjustment signals is provided.

[Configuration Example of Image Sensor]

Figure 22A:
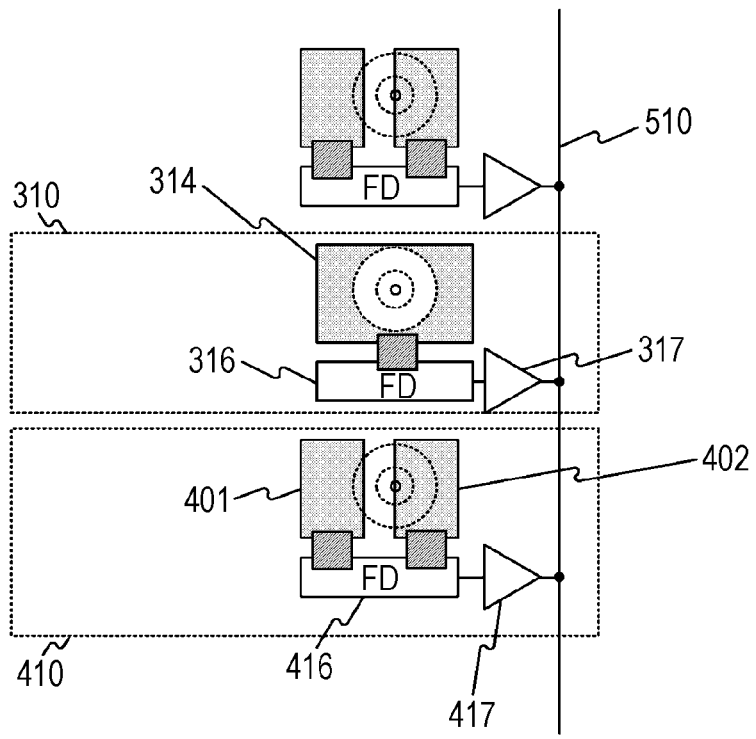
FIGS. 22A and 22B are schematic diagrams illustrating examples of a signal line of the image sensor according to a third embodiment.
Figure 22B:
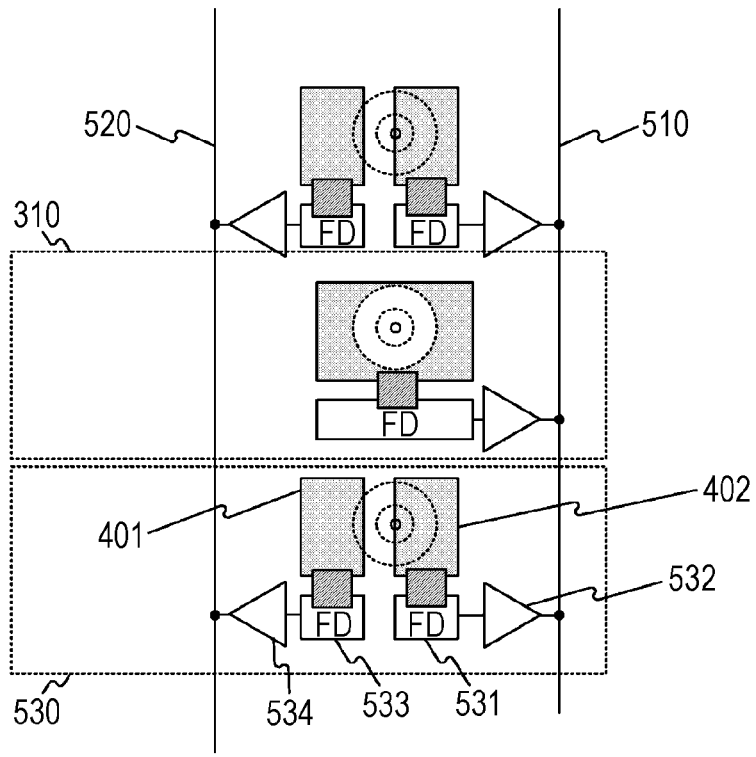

FIGS. 22A and 22B are schematic diagrams illustrating an example of a signal line of the image sensor 200 according to the third embodiment.

FIG. 22A illustrates the image pickup pixel 310 and the focus detection pixel 410 connected to a signal line similarly as in the image sensor 200, the image pickup pixel 310, and a focus detection pixel 530 according to the third embodiment.

FIG. 22A schematically illustrates the image pickup pixel 310 and the focus detection pixel 410 connected to the signal line similarly as in the image sensor 200 in the conventional image pickup apparatus. In FIG. 22A, one image pickup pixel 310 (center), two focus detection pixels 410 (upper stage, lower stage), and a first signal line 510 are illustrated.

Also, as the image pickup pixel 310, the light receiving element 314, an FD (Floating Diffusion) 316, and an amplifier 317 are illustrated. Also, as the focus detection pixel 410, the light receiving element 401, the second light receiving element 402, an FD 416, and an amplifier 417.

It should be noted that the light receiving element 314 in the image pickup pixel 310 and the first light receiving element 401 and the second light receiving element 402 in the focus detection pixel 410 are similar to those illustrated in the first embodiment, and a description herein will therefore be omitted.

The FD 316 and the FD 416 are floating diffusions of the image pickup pixel 310 and the focus detection pixel 410. These FD 316 and FD 416 detect charges of the light receiving elements. These FD 316 and FD 416 convert the detected charges into voltages to be supplied to the amplifier 317 and the amplifier 417.

The amplifier 317 and the amplifier 417 are configured to amplify the voltages supplied from the FD 316 and the FD 416. This amplifier 317 and the amplifier 417 supplies the amplified voltage to the first signal line 510.

The first signal line 510 is a signal line for reading out the image pickup signal generated by the image pickup pixel 310 and the focus adjustment signal generated by the focus detection pixel 410. The image pickup signal and the focus adjustment signal are read out via this first signal line 510 to the signal processing unit 130. For example, first, the focus adjustment signal of the light receiving element 401 in the focus detection pixel 410 on the upper stage of FIG. 21A is read out. Subsequently, the focus adjustment signal of the second light receiving element 402 in the focus detection pixel 410 on the upper stage is read out, and then, the image pickup signal of the image pickup pixel 310 on the center is read out. After that, the focus adjustment signal of the light receiving element 401 in the focus detection pixel 410 on the lower stage is read out, and finally, the focus adjustment signal of the second light receiving element 402 in the focus detection pixel 410 on the lower stage is read out.

In this manner, similarly as in the image sensor 200 in the conventional image pickup apparatus, in a case where the focus adjustment signal of the focus detection pixel 410 is read out via one signal line, a necessity occurs that read out of the focus adjustment signal of the focus detection pixel 410 is performed two times.

FIG. 22B schematically illustrates the image pickup pixel 310 and the focus detection pixel 410 to which the signal line of the image sensor 200 according to the third embodiment is connected. FIG. 22A illustrates one image pickup pixel 310 (center), two focus detection pixels 530 (upper stage, lower stage), the first signal line 510, and a second signal line 520.

To the first signal line 510, the image pickup pixel 310 (center) and the second light receiving elements 402 of the focus detection pixels 530 (upper stage, lower stage) are connected. To the second signal line 520, the light receiving elements 401 of the focus detection pixels 530 (upper stage, lower stage) are connected.

Here, a difference from the image sensor 200 in the conventional image pickup apparatus illustrated in FIG. 22A will be described. It should be noted that components except for the focus detection pixel 530 and the second signal line 520 are similar to those illustrated in FIG. 22A, and a description herein will therefore be omitted.

The focus detection pixel 530 is obtained by separately connecting the first light receiving element 401 and the second light receiving element 402 of the focus detection pixel 410 illustrated in FIG. 22A to the first signal line 510 and the second signal line 520. This focus detection pixel 530 is provided with an FD 533 for detecting the charge of the light receiving element 401 to be converted into a voltage and an amplifier 534 for amplifying the converted voltage. Also, this focus detection pixel 530 is provided with a FD 531 for detecting the charge of the second light receiving element 402 to be converted into a voltage and an amplifier 532 for amplifying the converted voltage.

The second signal line 520 is a signal line for reading out the focus adjustment signal generated by the light receiving element 401 in the focus detection pixel 530. This second signal line 520 takes out the focus adjustment signal of the light receiving element 401 simultaneously at a timing when the first signal line 510 takes out the focus adjustment signal of the second light receiving element 402 of the focus detection pixel 530.

In this manner, according to the third embodiment, by providing the second signal line 520, the time used for the supply of the focus adjustment signal to the signal processing unit 130 can be shortened. According to this, the time used for the generation of the image data for focus adjustment is shortened, and it is possible to shorten the time used for the focus control.

In this manner, according to the embodiment, by increasing the light receiving amount in either one of the light receiving elements of the pair of the light receiving elements and decreasing the light receiving amount in the other light receiving element, it is possible to improve the accuracy of the focus adjustment.

Although modifications and changes may be suggested by those skilled in the art, it is the intention of the inventors to embody within the patent warranted hereon all changes and modifications as reasonably and properly come within the scope of their contribution to the art.

Also, the processing procedure described in the embodiments may be grasped as a method including these series of procedures and also may be grasped as a program for causing a computer to execute these series of procedures or a recording medium storing the program. For this recording medium, for example, a CD (Compact Disc), an MD (MiniDisc), a DVD (Digital Versatile Disk), a memory card, a Blu-ray Disc (Blu-ray Disc (registered trademark)) or the like can be used.

What is claimed is:

1. An image pickup apparatus, comprising:
    an image sensor configured to perform photoelectric conversion on incident light to generate an electric signal, the image sensor having a first pixel and a second pixel that each include (a) a lens having an optical axis, (b) a first light receiving element configured to convert light from the lens into an electric signal, (c) a second light receiving element configured to convert light from the lens into an electric signal, and (d) an element separation area between the first light receiving element and the second light receiving element;
    a signal processing unit configured to (i) generate image data corresponding to electric signals from the first light receiving element, and (ii) generate image data corresponding to electric signals from the second light receiving element; and
    a control unit configured to (i) select image data corresponding to the first pixel and select image data corresponding to the second pixel, and (ii) calculate an image interval based on the selected image data from the first pixel and the selected image data from the second pixel,
    wherein the first and second light receiving elements are asymmetrically positioned with respect to the center of the lens.

2. The image pickup apparatus according to claim 1, wherein the element separation area comprises insulating material electrically separating the first light receiving element and the second light receiving element.

3. The image pickup apparatus according to claim 1, wherein, the image sensor includes a focus detection region, the focus detection region including at least the first pixel and the second pixel.

4. The image pickup apparatus according to claim 1, wherein, the first pixel and the second pixel are positioned in the focus detection region such that the first pixel is oriented in a first direction and the second pixel is oriented in a second direction different from the first direction.

5. The image pickup apparatus according to claim 1, wherein, the control unit is configured to (a) generate a focus detection signal based on the image interval, the focus detection signal indicating whether or not a current state of the image pickup lens is in-focus, and (b) supply a signal regarding a position of an image pickup lens based on the focus detection signal if the image pickup lens is not in-focus.

6. The image pickup apparatus according to claim 3, wherein:
    the image sensor further includes a third pixel having (a) a lens having an optical axis, (b) a first light receiving element configured to convert light from the lens into an electric signal, and (c) a second light receiving element configured to convert light from the lens into an electric signal; and
    the first and second light receiving elements of the third pixel are equidistant from the optical axis of the third pixel.

7. The image pickup apparatus according to claim 6, wherein the focus detection region includes the third pixel.

8. An image pickup apparatus, comprising:
    an image sensor configured to perform photoelectric conversion on incident light to generate an electric signal, the image sensor having a first pixel and a second pixel that each include (a) a lens having an optical axis, (b) a first light receiving element configured to convert light from the lens into an electric signal, (c) a second light receiving element configured to convert light from the lens into an electric signal, and (d) an element separation area between the first light receiving element and the second light receiving element; and a signal processing unit configured to (i) generate a first data corresponding to electric signals from the first light receiving element, and (ii) generate a second data corresponding to electric signals from the second light receiving element, wherein, an image interval is calculated based on the first data from the first pixel and the second data from the second pixel, and the first and second light receiving elements are asymmetrically positioned with respect to the center of the lens.

9. The image pickup apparatus according to claim 8, wherein the element separation area comprises insulating material electrically separating the first light receiving element and the second light receiving element.

10. The image pickup apparatus according to claim 8, wherein, the image sensor includes a focus detection region, the focus detection region including at least the first pixel and the second pixel.

11. The image pickup apparatus according to claim 8, wherein the first pixel and the second pixel are positioned in the focus detection region such that the first pixel is oriented in a first direction and the second pixel is oriented in a second direction different from the first direction.

12. The image pickup apparatus according to claim 8, further comprising a control unit, wherein the control unit is configured to (a) generate a focus detection signal based on the image interval, the focus detection signal indicating whether or not a current state of the image pickup lens is in-focus, and (b) supply a signal regarding a position of an image pickup lens based on the focus detection signal if the image pickup lens is not in-focus.

13. The image pickup apparatus according to claim 10, wherein the image sensor further includes a third pixel having (a) a lens having an optical axis, (b) a first light receiving element configured to convert light from the lens into an electric signal, and (c) a second light receiving element configured to convert light from the lens into an electric signal, and the first and second light receiving elements of the third pixel are equidistant from the optical axis of the third pixel.

14. The image pickup apparatus according to claim 13, wherein the focus detection region includes the third pixel.

\* \* \* \* \*